United States Patent
Etori et al.

(10) Patent No.: US 8,895,850 B2
(45) Date of Patent: Nov. 25, 2014

(54) PHTHALOCYANINE NANOROD AND PHOTOELECTRIC CONVERSION DEVICE

(75) Inventors: Hideki Etori, Sakura (JP); Hideyuki Murata, Sakura (JP); Norimasa Fukazawa, Sakura (JP); Shou Inagaki, Sakura (JP)

(73) Assignee: DIC Corporation (Tokyo), Tokyo (JP)

( * ) Notice: Subject to any disclaimer, the term of this patent is extended or adjusted under 35 U.S.C. 154(b) by 0 days.

(21) Appl. No.: 13/979,999

(22) PCT Filed: May 19, 2011

(86) PCT No.: PCT/JP2011/061531
§ 371 (c)(1),
(2), (4) Date: Aug. 15, 2013

(87) PCT Pub. No.: WO2012/157110
PCT Pub. Date: Nov. 22, 2012

(65) Prior Publication Data
US 2014/0158203 A1  Jun. 12, 2014

(51) Int. Cl.
| | | |
|---|---|---|
| *H01L 51/00* | (2006.01) | |
| *H01L 51/42* | (2006.01) | |
| *C09B 47/04* | (2006.01) | |
| *H01L 51/05* | (2006.01) | |
| *C09B 47/067* | (2006.01) | |
| *C09B 69/00* | (2006.01) | |
| *B82Y 20/00* | (2011.01) | |
| *B82Y 40/00* | (2011.01) | |
| *C09D 11/52* | (2014.01) | |
| *B82Y 30/00* | (2011.01) | |

(52) U.S. Cl.
CPC ............... *C09B 47/04* (2013.01); *H01L 51/42* (2013.01); *C09B 47/0678* (2013.01); *C09B 47/0673* (2013.01); *H01L 51/0091* (2013.01); *C09B 69/00* (2013.01); *B82Y 20/00* (2013.01); *C09B 47/0675* (2013.01); *H01L 51/4253* (2013.01); *B82Y 40/00* (2013.01); *H01L 51/0092* (2013.01); *H01L 51/0078* (2013.01); *C09D 11/52* (2013.01); *H01L 51/0558* (2013.01); *B82Y 30/00* (2013.01)
USPC .................. 136/263; 257/40; 438/99; 438/82; 252/501.1

(58) Field of Classification Search
None
See application file for complete search history.

(56) References Cited

U.S. PATENT DOCUMENTS 8,470,204 B2 * 6/2013 Etori et al. .................... 252/500

FOREIGN PATENT DOCUMENTS

| JP | 2006-245073 A | 9/2006 |
| JP | 2008-016834 A | 1/2008 |

(Continued)

OTHER PUBLICATIONS

International Search Report for PCT/JP2011/061531, mailing date of Aug. 16, 2011.

(Continued)

*Primary Examiner* — Ling Choi
*Assistant Examiner* — Catherine S Branch
(74) *Attorney, Agent, or Firm* — Westerman, Hattori, Daniels & Adrian, LLP

(57) ABSTRACT

The present invention provides a phthalocyanine nanorod; an ink composition containing the phthalocyanine nanorod; a transistor containing the phthalocyanine nanorod; a material for a photoelectric conversion device, the material containing the phthalocyanine nanorod; and a photoelectric conversion device containing the phthalocyanine nanorod between the positive electrode and the negative electrode. Since an ink composition containing a nanorod according to the present invention can be formed into a film by a wet process such as a coating method or a printing method, an electronic device that is less likely to fail and is lightweight and inexpensive can be produced on a flexible plastic substrate.

15 Claims, 2 Drawing Sheets

(56) References Cited

FOREIGN PATENT DOCUMENTS

JP      2009-252768 A    10/2009
WO     2010/122921 A1   10/2010

OTHER PUBLICATIONS

Wang, Chia-Yu, et al., "Structural transformation and crystallization of amorphous copper phthalocyanine nanostructures", Thin Solid Films, vol. 518, pp. 6720-6728, (2010).

Kharisov, Boris I., et al., "Nonsubstituted Phthalocyanine Nanostructures Obtained Using Activated Metals and Unstable Complexes at Ambient Temperature", Journal of Composite Materials, vol. 44, pp. 2145-2155, (2010).

Li, Ligui et al., "Improving performance of polymer photovoltaic devices using an annealing-free approach via construction of ordered aggregates in solution", Journal of Materials Chemistry, 2008, vol. 18, pp. 1984-1990.

\* cited by examiner

PHTHALOCYANINE NANOROD AND PHOTOELECTRIC CONVERSION DEVICE

TECHNICAL FIELD

The present invention relates to a phthalocyanine nanorod; an ink composition containing the phthalocyanine nanorod; a transistor containing the phthalocyanine nanorod; a material for a photoelectric conversion device, the material containing the phthalocyanine nanorod; and a photoelectric conversion device containing the phthalocyanine nanorod between the positive electrode and the negative electrode.

BACKGROUND ART

In contrast to silicon-based solar cells, which are mainly used, organic thin-film solar cells have huge potential because of, for example,
(1) low environmental load,
(2) low production cost, and
(3) lightweight and high durability,
and hence have been attracting attention in recent years. Such an organic thin-film solar cell is a photoelectric conversion device composed of organic semiconductor materials. In the organic thin-film solar cell, an organic semiconductor layer composed of an electron-donating material (donor) that is an organic semiconductor material and an electron-accepting material (acceptor) that is an organic semiconductor material serves as a photoelectric-conversion active layer (photoelectric conversion layer). Examples of the electron-donating material include electron-donating π-conjugated polymers, such as polythiophene polymers and polyphenylenevinylene polymers, and electron-donating low-molecular-weight materials, such as phthalocyanines. Examples of the electron-accepting material include fullerenes. In particular, bulk heterojunction solar cells in which a nano-composite of the electron-donating material and the electron-accepting material is formed to increase the area of the interface between the materials that contributes to photoelectric conversion (the interface being referred to as the DA junction) have been recently actively developed (Patent Literature 1).

The photoelectric-conversion principle of an organic thin-film solar cell is as follows:
(1) an organic semiconductor layer absorbs light to form excitons (pairs of holes and electrons),
(2) the excitons migrate by diffusion to the DA junction,
(3) the excitons separate into charges of holes and electrons, and
(4) these charges are transported through the electron-donating material and the electron-accepting material to a positive electrode and a negative electrode to produce electric power.
The product of the efficiencies of such steps governs the photoelectric conversion efficiency. The life of excitons is very short and a distance over which excitons can migrate by diffusion is very short: at most several nanometers to less than twenty nanometers. Accordingly, to increase the photoelectric conversion efficiency, the DA junction of the organic semiconductor layer should be preferably present within a distance that substantially equals to the distance over which excitons can migrate by diffusion (exciton diffusion range); and charge-transport paths along which charges after the charge separation can be rapidly transported to the electrodes are preferably ensured.

Unless the DA junction is distributed within the range of about several tens of nanometers in the organic semiconductor layer, there is a problem that excitons formed in the step (1) are deactivated before reaching the DA junction and charges are not extracted. Unless charge-transport paths of the electron-donating material and the electron-accepting material in the organic semiconductor layer are ensured, there is a problem that charges formed in the step (3) cannot reach the positive electrode or the negative electrode and an electromotive force is not obtained.

In view of the above-described points, to increase the efficiency of a photoelectric conversion device, an object is to form the DA junction within the exciton diffusion range and to ensure charge-transport paths formed of the electron-donating material and the electron-accepting material. Stated another way, an object is to form the network of the electron-donating material and the electron-accepting material in the organic semiconductor layer without isolation (formation of discontinuity) of these materials.

The most typical configuration of an organic thin-film solar cell (organic photoelectric conversion device) is bulk heterojunction in which an electron-donating material that is a π-conjugated polymer such as poly-3-hexylthiophene (hereafter, P3HT) and an electron-accepting material that is a fullerene derivative, [6,6]-phenyl-C61-butyric acid methyl ester (hereafter, PCBM), are mixed and the mixture is formed into a thin film so that DA junction is formed in the entire region of the film.

A photoelectric conversion device formed of an electron-donating π-conjugated polymer and PCBM is advantageous in that production thereof does not require expensive production equipment and can be achieved at a low cost because a film of these organic materials can be readily formed from a solution in which the organic materials are dissolved, by a wet process (printing or coating). However, π-conjugated polymers generally have a problem in durability because, for example, they are susceptible to an oxidation reaction with oxygen in the air and are degraded by strong light radiation. Accordingly, photoelectric conversion devices formed of such materials have a short life. In addition, in such a film-formation process, the network constituted by the electron-donating material and the electron-accepting material is "accidentally" formed through phase separation caused by the film formation and the subsequent treatment. Thus, isolated electron-donating and electron-accepting materials are indispensably present and hence there are cases where transport paths necessary for charge transport are not sufficiently ensured, which causes a decrease in the conversion efficiency.

In recent years, to increase the charge-transport efficiency in the step (4) of the "photoelectric-conversion principle", a photoelectric conversion device containing a nanowire-shaped electron-donating material has been proposed (Non Patent Literature 1). Specifically, the shape of P3HT, which is an electron-donating π-conjugated polymer, is controlled to be nanowires, that is, fine wires having a width of about several tens of nanometers to increase the charge-transport efficiency. As a result, the P3HT/PCBM photoelectric conversion device containing P3HT nanowires has a higher photoelectric conversion efficiency than P3HT/PCBM photoelectric conversion devices without containing the nanowires.

Thus, it has been confirmed that photoelectric conversion devices containing polymeric nanowires advantageously have enhanced photoelectric conversion efficiency. However, as described above, polymers such as P3HT generally have low durability stemming from low oxygen resistance and low light resistance. Therefore, the problems of photoelectric conversion devices in view of practicality have not been overcome.

In contrast, electron-donating low-molecular-weight materials such as phthalocyanines have high resistance to oxygen and light and are expected to provide photoelectric conversion devices having a sufficiently long life. However, since the materials have a low molecular weight, it is difficult to form the networks (transport paths necessary for charge transport are less likely to be ensured) and it is also difficult to form films by wet processes. Accordingly, the films have been formed by vapor deposition methods, which incur high cost. However, in recent years, photoelectric conversion devices that contain an electron-donating low-molecular-weight material and that are produced by a coating method have been proposed (Patent Literature 2). In these photoelectric conversion devices, a film is formed by a wet process using a solvent-soluble precursor and the resultant film is heated so that the precursor is turned into an electron-donating material. For example, photoelectric conversion devices in which an electron-donating material is a benzoporphyrin, an electron-accepting material is a fullerene such as PCBM, and a film thereof can be formed by a coating method are advantageous in that they have higher durability such as oxygen resistance and light resistance than conventional photoelectric conversion devices using electron-donating π-conjugated polymers.

However, in the case of using a solvent-soluble precursor, a heating operation requiring extra time and energy is necessary for the precursor to convert the precursor into a material for a photoelectric conversion device, which is not necessarily preferable in terms of production cost. In addition, as in the cases of using π-conjugated polymers, the network structure of the organic semiconductor layer is "accidentally" formed through phase separation caused by a heating treatment. Thus, isolated electron-donating and electron-accepting materials are indispensably present and hence charge-transport paths are not sufficiently ensured, which causes a decrease in the efficiency.

On the other hand, Patent Literature 3 discloses a photoelectric conversion device including an organic semiconductor layer formed of fine particles derived from a phthalocyanine pigment (phthalocyanine pigment fine particles) by a wet process. However, in the phthalocyanine pigment fine particles, the crystal orientation within the fine particles is not controlled and, as a result, the phthalocyanine molecules are randomly oriented and are not suitable for charge transport.

Patent Literature 4 describes, for example, a phthalocyanine nanowire formed by one-dimensional crystal growth of phthalocyanine; and an ink composition containing the phthalocyanine nanowire and an organic solvent as essential components.

CITATION LIST

Patent Literature

PTL 1: Japanese Unexamined Patent Application Publication No. 2006-245073
PTL 2: Japanese Unexamined Patent Application Publication No. 2008-016834
PTL 3: Japanese Unexamined Patent Application Publication No. 2009-252768
PTL 4: WO/2010/122921A1

Non Patent Literature

NPL 1: Journal of Materials Chemistry, 2008, vol. 18, P. 1984-1990

SUMMARY OF INVENTION

Technical Problem

In view of the problems, the present invention has been accomplished. An object of the present invention is to provide an organic semiconductor material that provides, by a low-cost wet process, a structure suitable for charge transport and has high durability; and a photoelectric conversion device that is less likely to fail, is lightweight and inexpensive, and has high characteristics.

Solution to Problem

The inventors of the present invention have performed thorough studies on how to achieve the object. As a result, the inventors have found that, by forming phthalocyanines into nanorods, an organic semiconductor material suitable for a wet process can be provided. Thus, the inventors have accomplished the present invention. In addition, the inventors have found that, by using the organic semiconductor material as an electron-donating material, a photoelectric conversion device that has high durability and is excellent in a charge transport property can be provided at a low cost. Thus, the inventors have accomplished the present invention.

Specifically, the present invention provides, as an electron-donating material, a phthalocyanine nanorod having a breadth of 100 nm or less and a ratio (length/breadth) of a length to the breadth, the ratio being less than 10; an ink composition containing the phthalocyanine nanorod; a transistor containing the phthalocyanine nanorod; a material for a photoelectric conversion device, the material containing the phthalocyanine nanorod; and a photoelectric conversion device containing the phthalocyanine nanorod.

Advantageous Effects of Invention

According to the present invention, since a phthalocyanine nanorod according to the present invention is composed of phthalocyanines having high durability, a photoelectric conversion device having a long life can be provided. In addition, a phthalocyanine nanorod according to the present invention has higher solvent dispersibility than phthalocyanine pigment fine particles; accordingly, an ink composition can be easily formed from the phthalocyanine nanorod and hence a film can be formed by a wet process; thus, a photoelectric conversion device that is less likely to fail and is lightweight and inexpensive can be produced on, for example, a flexible plastic substrate. In addition, since a phthalocyanine nanorod according to the present invention has higher orientation controllability of phthalocyanine molecules over the entire particles than phthalocyanine pigment fine particles, the charge-transport efficiency can be increased. In addition, since a phthalocyanine nanorod according to the present invention has a lower aspect ratio than phthalocyanine nanowires, the charge-transport efficiency is increased and, as a result, a photoelectric conversion device having enhanced photoelectric conversion characteristics (in particular, fill factor (FF)) can be provided.

Figure 1:
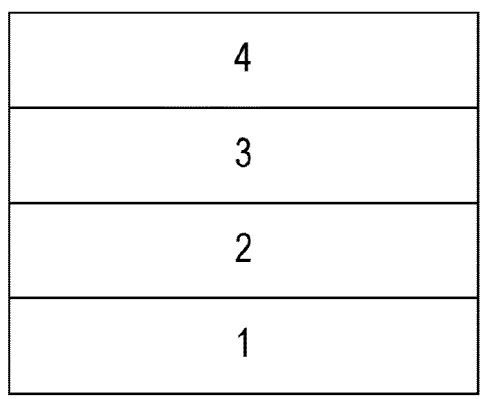
FIG. 1 is a schematic sectional view of a photoelectric conversion device according to the present invention.

BEST MODES FOR CARRYING OUT THE INVENTION (Phthalocyanine Nanorod)

Hereinafter, a phthalocyanine nanorod according to the present invention will be described.

A phthalocyanine nanorod having a breadth of 100 nm or less and a ratio (length/breadth) of a length to the breadth, the ratio being less than 10, according to the present invention is, for example, a phthalocyanine nanorod composed of an unsubstituted phthalocyanine and a substituted phthalocyanine (phthalocyanine derivative).

An unsubstituted phthalocyanine of a phthalocyanine nanorod according to the present invention may be a phthalocyanine represented by a general formula (1) and a metal-free phthalocyanine represented by a formula (2).

[Chem. 1]

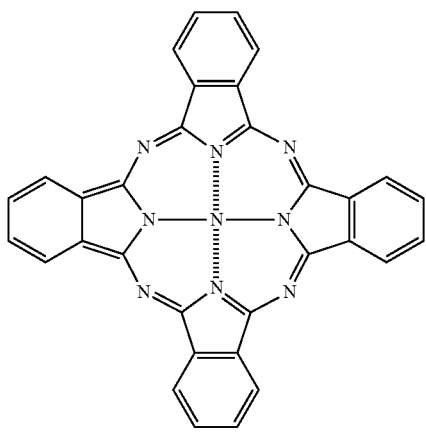

(1)

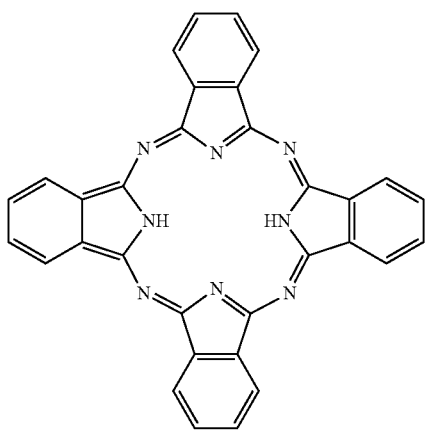

(2)

In the general formula (1), X is not particularly limited as long as it forms phthalocyanine. Examples of X include metal atoms such as a copper atom, a zinc atom, a cobalt atom, a nickel atom, a tin atom, a lead atom, a magnesium atom, a silicon atom, an iron atom, and a palladium atom; and metal oxides and metal halides such as titanyl (TiO), vanadyl (VO), and aluminum chloride (AlCl). Of these, particularly preferred are a copper atom, a zinc atom, and an iron atom.

A substituted phthalocyanine of a phthalocyanine nanorod according to the present invention may be a phthalocyanine derivative represented by a general formula (3) or (4) below.

[Chem. 2]

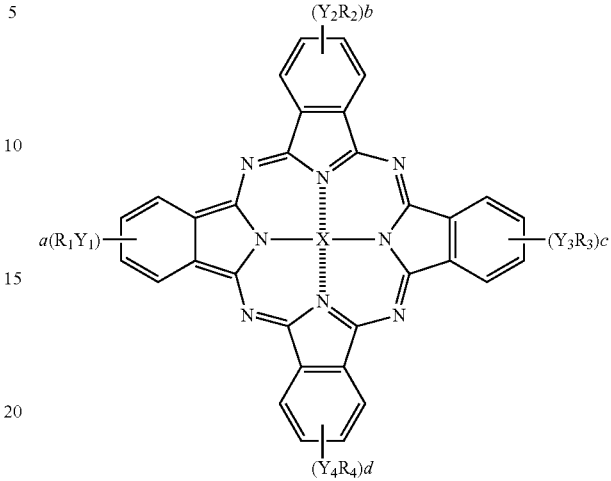

(3)

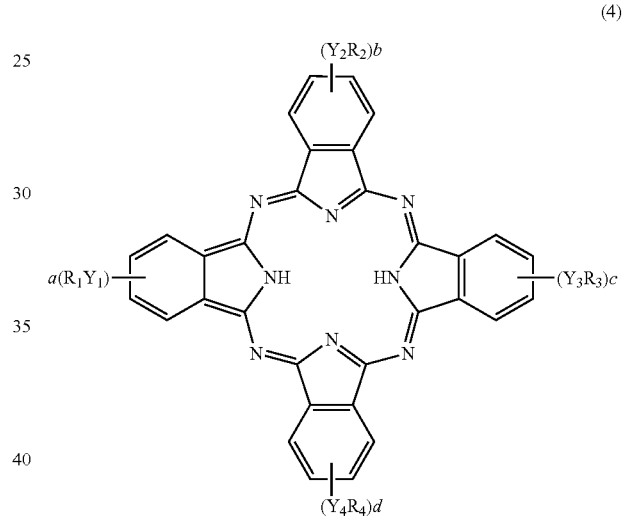

(4)

In the general formula (3), X is not particularly limited as long as it is publicly known and commonly used as a central metal of metal phthalocyanines. Preferred examples of X include a copper atom, a zinc atom, a cobalt atom, a nickel atom, a tin atom, a lead atom, a magnesium atom, a silicon atom, an iron atom, and a palladium atom. Other examples of X include metal oxides and metal halides such as titanyl (TiO), vanadyl (VO), and aluminum chloride (AlCl). As illustrated in the general formula (4), a metal-free phthalocyanine derivative that does not contain the central metal X may be used as the substituted phthalocyanine.

In the general formula (3) or (4), $Y_1$ to $Y_4$ represent bonding groups that bond the phthalocyanine skeleton to $R_1$ to $R_4$. When $Y_1$ to $Y_4$ serving as bonding groups are not present, $R_1$ to $R_4$ each represent —$SO_3H$, —$CO_2H$, an alkyl group that may optionally have a substituent, an (oligo)aryl group that may optionally have a substituent, an (oligo)heteroaryl group that may optionally have a substituent, a phthalimide group that may optionally have a substituent, or a fullerene that may optionally have a substituent.

In the general formula (3) or (4), $Y_1$ to $Y_4$ are not particularly limited as long as they represent bonding groups that bond the phthalocyanine ring to $R_1$ to $R_4$. Examples of the bonding groups include an alkylene group, an arylene group, a heteroarylene group, a vinylene bonding, ethinylene, a sulfide group, an ether group, a sulfoxide group, a sulfonyl group, a urea group, a urethane group, an amide group, an amino group, an imino group, a ketone group, and an ester group: specifically, for example, —(CH$_2$)$_n$— (n represents an integer of 1 to 10), —CH=CH—, —C≡C—, —O—, —NH—, —S—, —S(O)—, and —S(O)$_2$—. Fullerenes may be used as bonding groups in the present invention. In the general formula (3) or (4), R$_1$ to R$_4$ are functional groups that can be bonded to the phthalocyanine ring through the bonding groups Y$_1$ to Y$_4$.

Specific examples of the functional groups include an alkyl group, an alkyloxy group, an amino group, a mercapto group, a carboxy group, a sulfonic group, a silyl group, a silanol group, a boronic group, a nitro group, a phosphate group, an aryl group, a heteroaryl group, a cycloalkyl group, a heterocycloalkyl group, a nitrile group, an isonitrile group, an ammonium salt, a fullerene, and a phthalimide group: specifically, for example, an aryl group such as a phenyl group or a naphthyl group; a heteroaryl group such as an indoyl group or a pyridinyl group; and an alkyl group such as a methyl group. Of these, examples of specific preferred groups include —SO$_3$H, —CO$_2$H, an alkyl group that may optionally have a substituent, an alkyl group having an ether group or an amino group, an (oligo)aryl group that may optionally have a substituent, an (oligo)heteroaryl group that may optionally have a substituent, a phthalimide group that may optionally have a substituent, and a fullerene that may optionally have a substituent.

Examples of the alkyl group that may optionally have a substituent include alkyl groups having 1 to 20 carbon atoms. In particular, lower alkyl groups such as a methyl group, an ethyl group, and a propyl group are preferred. An alkyl group having an ether group or an amino group is also preferred and, for example, groups represented by the following formulae may be used.

[Chem. 3]

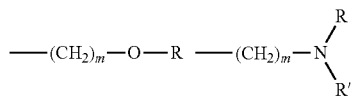

(where m represents an integer of 1 to 20; and R and R' each independently represent an alkyl group or an aryl group having 1 to 20 carbon atoms.)

Preferred examples of the (oligo)aryl group that may optionally have a substituent include a phenyl group that may optionally have a substituent, a naphthyl group that may optionally have a substituent, an oligophenylene group that may optionally have a substituent, and an oligonaphthyl group that may optionally have a substituent. Examples of such a substituent include publicly known general substituents with which aryl groups can be substituted.

Preferred examples of the (oligo)heteroaryl group that may optionally have a substituent include a pyrrole group that may optionally have a substituent, a thiophene group that may optionally have a substituent, an oligopyrrole group that may optionally have a substituent, and an oligothiophene group that may optionally have a substituent. Examples of such a substituent include publicly known general substituents with which heteroaryl groups can be substituted.

Examples of the fullerene that may optionally have a substituent include unsubstituted fullerenes and fullerenes having publicly known general substituents, such as C60 fullerene, C70 fullerene, and [6,6]-phenyl-C61-butyric acid methyl ester (PCBM).

The phthalimide group that may optionally have a substituent may be a group represented by the following formula.

[Chem. 4]

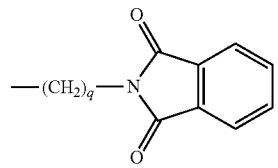

(where q represents an integer of 1 to 20.) Examples of the substituent include publicly known general substituents with which the phthalimide group can be substituted.

a, b, c, and d each independently represent an integer of 0 to 4 and the numbers of substituents Y$_1$R$_1$ to Y$_4$R$_4$ of the phthalocyanine ring. At least one of a to d representing the numbers of substituents of the phthalocyanine ring is not zero.

Non-limiting specific examples of a substituted phthalocyanine represented by the general formula (3) include phthalocyanines below. The numbers attached to the parentheses in the formulae of the substituted phthalocyanines represent the average number of the substituents introduced per phthalocyanine molecule. These numbers are decimal fractions. This is because although the numbers of the substituents introduced into individual molecules are integers, molecules having different numbers of substituents introduced are actually used in combination.

[Chem. 5]

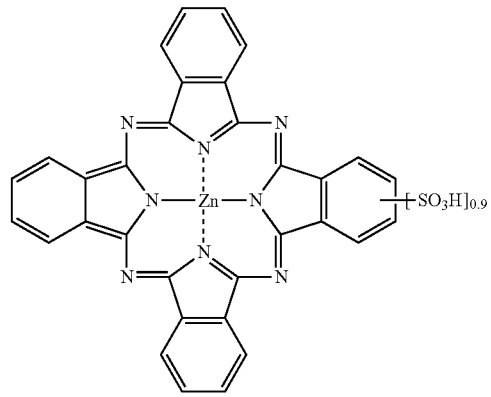

[Chem. 6]

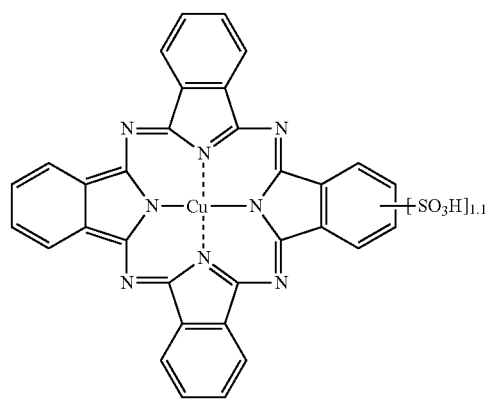

[Chem. 7]

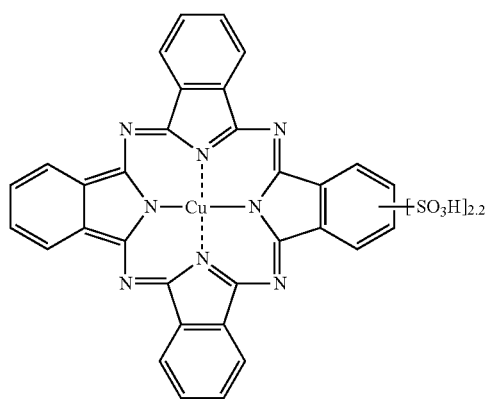

[Chem. 8]

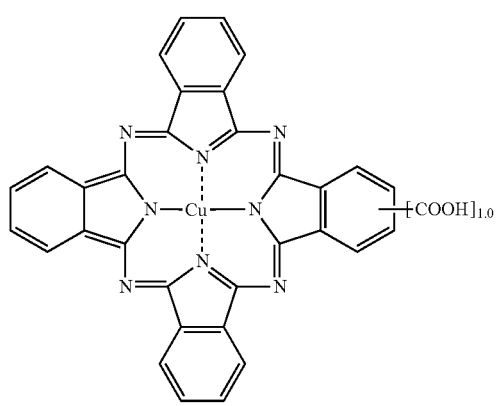

[Chem. 9]

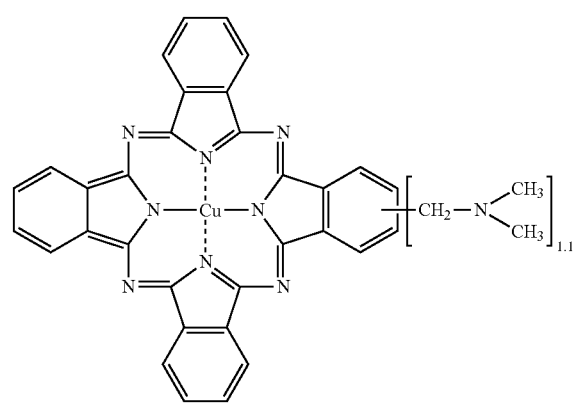

[Chem. 10]

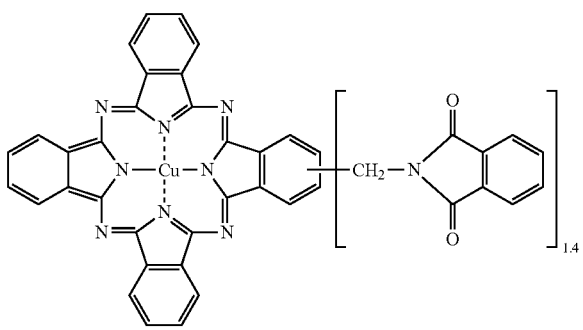

[Chem. 11]

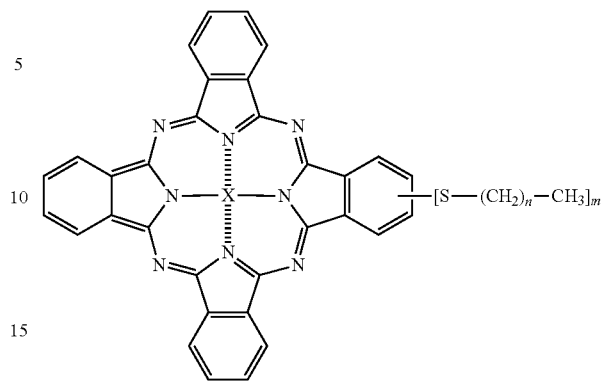

(where X represents a copper atom or a zinc atom; n represents an integer of 1 to 20; and m represents the average number of the substituent introduced, the average number being 0 to 4.)

[Chem. 12]

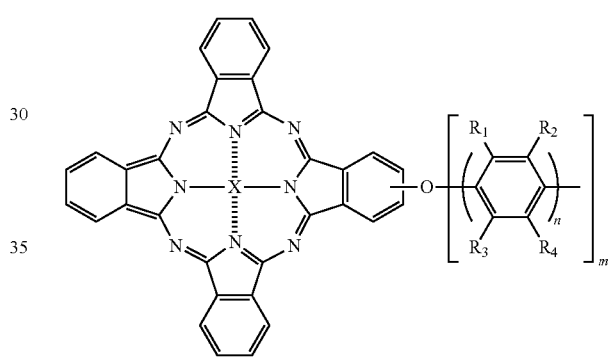

(where X represents a copper atom or a zinc atom; n represents an integer of 1 to 20; m represents the average number of the substituent introduced, the average number being 0 to 4; and $R_1$ to $R_4$ each independently represent a hydrogen atom, a halogen, an alkyl group having 1 to 20 carbon atoms, an alkyloxy group having 1 to 20 carbon atoms, or an alkylthio group having 1 to 20 carbon atoms.)

[Chem. 13]

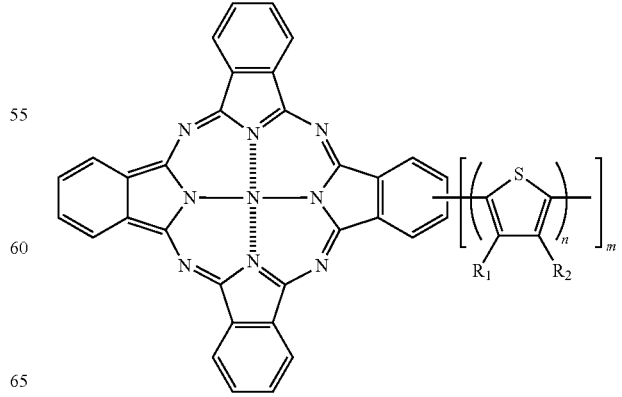

(where X represents a copper atom or a zinc atom; n represents an integer of 1 to 20; m represents the average number of the substituent introduced, the average number being 0 to 4; and $R_1$ and $R_2$ each independently represent a hydrogen atom, a halogen, an alkyl group having 1 to 20 carbon atoms, an alkyloxy group having 1 to 20 carbon atoms, or an alkylthio group having 1 to 20 carbon atoms.)

Examples of specific compounds represented by the general formula (4) include phthalocyanine derivatives having no central metals in the formulae (Chem. 5) to (Chem. 13).

The substituted phthalocyanines (phthalocyanine derivatives) represented by the general formulae (3) and (4) can be synthesized by introducing side chains or functional groups into phthalocyanine rings. The sulfonated copper phthalocyanines described in (Chem. 5), (Chem. 6), and (Chem. 7) can be obtained by heating copper phthalocyanine in fuming sulfuric acid (concentration of sulfur trioxide: 20%). The compound in (Chem. 10) can be synthesized by, for example, the method disclosed in U.S. Pat. No. 2,761,868.

The above-described various substituted phthalocyanines (phthalocyanine derivatives) can be obtained by, for example, publicly known and commonly used methods for synthesizing phthalocyanines described in Japanese Unexamined Patent Application Publication Nos. 2005-145896 and 2007-39561. For example, various phthalonitrile compounds such as 4-phenoxy-phthalonitrile, 4-phenylthio-phthalonitrile, and 4-(1,3-benzothiazole-2-yl)-phthalonitrile are mixed with unsubstituted ortho-phthalonitrile in desired proportions and the mixture is heated in the presence of an organic base such as 1,8-diazabicyclo[5,4,0]undec-7-ene with metal salts such as copper (II) sulfate and zinc (II) chloride in ethylene glycol to thereby synthesize a phthalocyanine derivative having the various functional groups in desired proportions. The number of such a functional group in a phthalocyanine derivative synthesized with such a phthalonitrile compound serving as one of the starting materials can be freely changed by changing the mixing proportions of the phthalonitrile compound and ortho-phthalonitrile. For example, when a phthalocyanine derivative having a single functional group per phthalocyanine molecule on average is to be synthesized, the phthalonitrile derivative and ortho-phthalonitrile are mixed in a ratio of 1:3; in the case of introducing 1.5 functional groups on average, the synthesis is performed in a ratio of 3:5 by, for example, a method described in a patent literature. A phthalocyanine derivative having different functional groups may be synthesized from two or more phthalonitrile compounds and ortho-phthalonitrile.

Such phthalonitrile derivatives having a substituent include, in addition to those described above, publicly known and commonly used various phthalonitrile derivatives. Examples of such starting materials for synthesizing substituted phthalocyanines usable in the present invention include Chem. 2 in the paragraph 0001 of Japanese Unexamined Patent Application Publication No. 2007-519636; Chem. 2 in the paragraph 0006 of Japanese Unexamined Patent Application Publication No. 2007-526881; phthalonitrile derivatives having oligothiophenes described in Chem. 2 in the paragraph 0014 of Japanese Unexamined Patent Application Publication No. 2006-143680; and a phthalonitrile derivative having a fullerene in Chem. 9 in the paragraph 0021 of Japanese Unexamined Patent Application Publication No. 2009-135237.

A substituted phthalocyanine that forms a phthalocyanine nanorod according to the present invention may be a phthalocyanine derivative represented by the following general formula (5) or (6).

[Chem. 14]

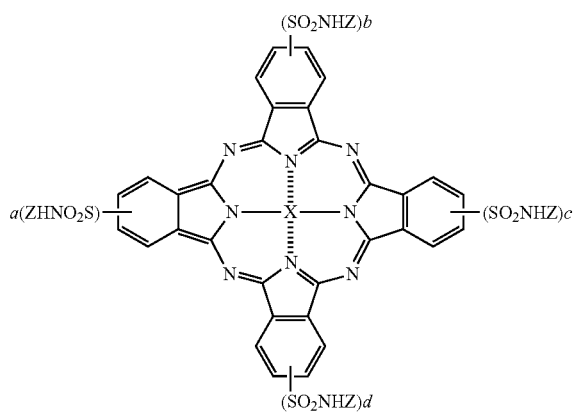

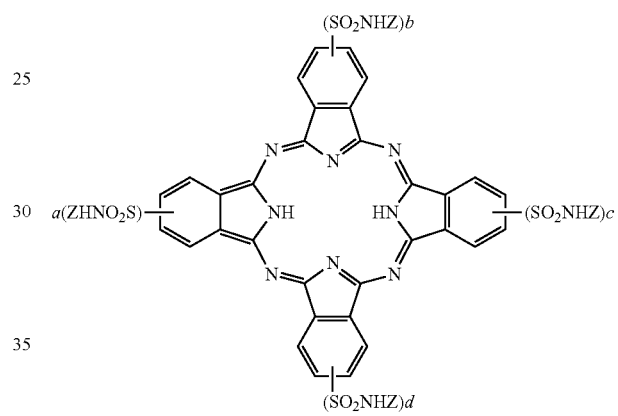

(where X is not particularly limited as long as it is publicly known and commonly used as a central metal of metal phthalocyanines. Preferred examples of X include a copper atom, a zinc atom, a cobalt atom, a nickel atom, a tin atom, a lead atom, a magnesium atom, a silicon atom, an iron atom, and a palladium atom. Other examples of X include metal oxides and metal halides such as titanyl (TiO), vanadyl (VO), and aluminum chloride (AlCl). As illustrated in the general formula (6), a metal-free phthalocyanine derivative that does not contain the central metal X may be used as the substituted phthalocyanine. Z represents a group represented by a formula (a) or (b) below; a, b, c, and d each independently represent an integer of 0 to 4 and at least one of a to d is not zero.)

[Chem. 15]

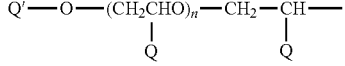

(where n represents an integer of 4 to 100; Q each independently represents a hydrogen atom or a methyl group; and Q' represents an acyclic hydrocarbon group having 1 to 30 carbon atoms.)

[Chem. 16]

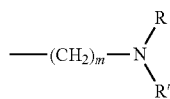

(b)

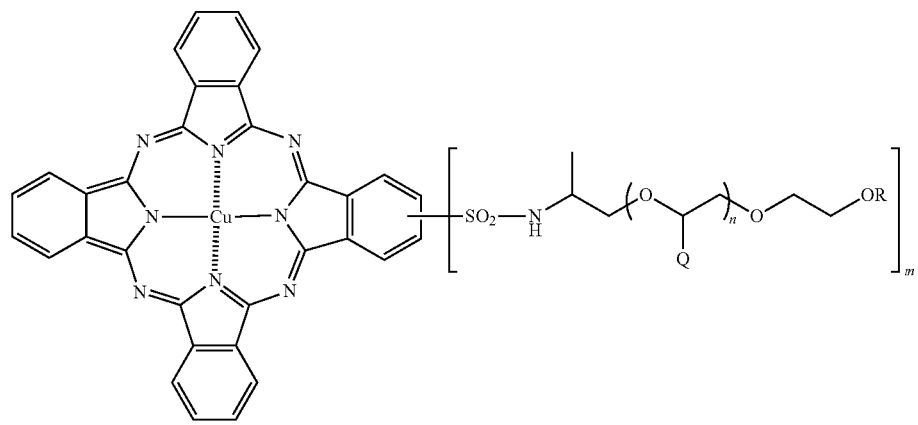

(where m represents an integer of 1 to 20; and R and R' each independently represent an alkyl group having 1 to 20 carbon atoms.)

The substituted phthalocyanine (phthalocyanine derivative) represented by the general formula (5) or (6) is a compound whose phthalocyanine ring has been substituted with one or more sulfamoyl groups. The number of sulfamoyl groups introduced per phthalocyanine ring is not particularly limited as long as it is at least one; preferably one or two sulfamoyl groups, more preferably one sulfamoyl group. The substitution positions are not particularly limited.

The most preferred example of Z in the present invention is a polyalkylene oxide copolymer represented by the general formula (a). Examples of this copolymer include all the polyalkylene oxides such as ethylene oxide polymer and ethylene oxide/propylene oxide copolymer; and the copolymer may be a block copolymer or a random copolymer.

Q', which represents an acyclic hydrocarbon group having 1 to 30 carbon atoms, may be a linear hydrocarbon group or a branched hydrocarbon group; and such a hydrocarbon group may be a saturated hydrocarbon group or an unsaturated hydrocarbon group. Examples of the acyclic hydrocarbon group include linear or branched saturated hydrocarbon groups such as a methyl group, an ethyl group, a n-propyl group, an isopropyl group, a n-butyl group, an isobutyl group, a n-pentyl group, a n-hexyl group, a n-octyl group, a 2-ethylhexyl group, a n-dodecyl group, a stearyl group, a n-tetracosyl group, and a n-triacontyl group.

As for the linear or branched unsaturated hydrocarbon group, the hydrocarbon group may have a double bond or a triple bond. Examples of the linear or branched unsaturated hydrocarbon group include a vinyl group, a propenyl group, an isopropenyl group, a butenyl group, a pentenyl group, an isoprene group, a hexenyl group, a heptenyl group, an octenyl group, a decenyl group, a geranyl group, an ethynyl group, a 2-propynyl group, and a 2-pentene-4-ynyl group.

The number n of the polyalkylene oxide unit repeated is not particularly limited; in view of affinity for a dispersion medium, that is, the dispersion stability of the resultant nanorods, the number n is preferably 4 or more and 100 or less, more preferably 5 or more and 80 or less, still more preferably 10 or more and 50 or less.

A non-limiting example of a phthalocyanine derivative represented by the general formula (5) is a compound in a formula (Chem. 17).

[Chem. 17]

(where Q and R represent a hydrogen atom or a methyl group; n represents 4 to 100; and the introduction number m of the polyalkylene oxide chain bonded to the phthalocyanine through the sulfamoyl bonding is an average introduction number with respect to the four benzene rings of the phthalocyanine, the average introduction number being 0 to 4.)

Other than the phthalocyanine derivative above mentioned, a substituted phthalocyanine (phthalocyanine derivative) represented by the general formula (5) may have, as Z, a group represented by the general formula (b).

Preferred examples of R and R' are lower alkyl groups, in particular, a methyl group. m preferably represents 1 to 6. A specific preferred phthalocyanine derivative is described below. The number attached to the parentheses in the formula of the substituted phthalocyanine represents the average number of the substituent introduced per phthalocyanine molecule. The number is a decimal fraction. This is because although the numbers of the substituent introduced into individual molecules are integers, molecules having different numbers of the substituent introduced are actually used in combination.

[Chem. 18]

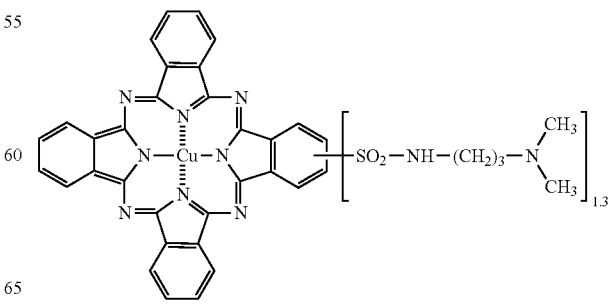

A substituted phthalocyanine (phthalocyanine derivative) represented by the general formula (5) can be produced by combined use of publicly known and commonly used methods: for example, the reaction between copper phthalocyanine sulfonyl chloride and a polyetheramine having an amine at an end of a polyether main chain (hereafter, abbreviated as "polyethermonoamine"), or the reaction between copper phthalocyanine sulfonyl chloride and an amine represented by the following formula.

[Chem. 19]

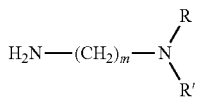

(where m represents 1 to 20; and R and R' each independently represent an alkyl group having 1 to 20 carbon atoms.)

The copper phthalocyanine sulfonyl chloride serving as a starting material can be obtained by the reaction between copper phthalocyanine and chlorosulfonic acid or thionyl chloride. The polyethermonoamine serving as the other starting material can be obtained by a publicly known and commonly used method. For example, it can be obtained by reductive amination of a hydroxy group at an end of a polyether skeleton with a nickel/copper/chromium catalyst; or it can be obtained by imidization of a hydroxy group at an end of a polyether skeleton through Mitsunobu reaction (reference: Synthesis, 1981, P. 1) and subsequent amination of the imide through hydrazine reduction (reference: Chemical Communications, 2003, P. 2062).

The polyethermonoamine is also commercially available: for example, JEFF AMINE M series (trade name, manufactured by Huntsman Corporation).

(Method for Producing Phthalocyanine Nanorod)

Hereinafter, methods (I) to (III) for producing a phthalocyanine nanorod used in the present invention will be described.

In the production methods (I) and (II), phthalocyanine nanowires are produced and the aspect ratio of the phthalocyanine nanowires is then decreased to provide nanorods. The method for producing phthalocyanine nanowires may be, for example, the method described in WO2010/122921. On the other hand, in the production method (III), phthalocyanines are one-dimensionally crystallized so as to have a low aspect ratio. Hereinafter, these methods will be specifically described.

<Production Method (I)>

The production method includes:

(a) a step of dissolving an unsubstituted phthalocyanine and a substituted phthalocyanine (phthalocyanine derivative) in acid and subsequently precipitating the phthalocyanines in a poor solvent, to provide a composite, (b) a step of forming the composite into nanowires, and (c) a step of forming the nanowires into nanorods.

Step (a)

It is generally known that phthalocyanines are soluble in acid solvents such as sulfuric acid. The unsubstituted phthalocyanine and the substituted phthalocyanine are first dissolved in an acid solvent such as sulfuric acid, chlorosulfuric acid, methanesulfonic acid, or trifluoroacetic acid. The resultant solution is subsequently added to a poor solvent such as water to precipitate a composite of the unsubstituted phthalocyanine and the phthalocyanine derivative having a substituent.

The mixing percentage of the phthalocyanine derivative having a substituent with respect to the unsubstituted phthalocyanine is preferably in the range of 1 to 200 mass %, more preferably in the range of 1 to 120 mass %. When the mixing percentage is 1 mass % or more, the substituent (functional group or polymer side chain) of the substituted phthalocyanine sufficiently causes unidirectional crystal growth (one-dimensional crystal growth) in the step (b) described below, resulting in the formation of nanowires. When the mixing percentage is 200 mass % or less, since the amount of the functional group or the polymer side chain is not so large and crystal growth is not inhibited, nanowires are sufficiently formed through one-dimensional crystal growth without the formation of an amorphous state, plates, or particles.

The amount of the unsubstituted phthalocyanine and the substituted phthalocyanine added to the acid solvent is not particularly limited as long as the phthalocyanines do not remain undissolved and are completely dissolved in the acid solvent. To keep the resultant solution to have such a viscosity that the solution has sufficient flowability, the concentration of the phthalocyanines in the solution is preferably 20 mass % or less.

When the solution in which the unsubstituted phthalocyanine and the substituted phthalocyanine have been dissolved is added to a poor solvent such as water to precipitate a composite of the unsubstituted phthalocyanine and the substituted phthalocyanine, the percentage of the solution with respect to the poor solvent is preferably in the range of 0.01 to 50 mass %. When the percentage is 0.01 mass % or more, the composite is precipitated at a sufficiently high concentration and hence the solid content is readily collected. When the percentage is 50 mass % or less, the entirety of the unsubstituted phthalocyanine and the substituted phthalocyanine is precipitated to form a solid composite. Thus, there are no dissolved components and therefore the phthalocyanines are readily collected.

The poor solvent is not particularly limited as long as it is a liquid in which the unsubstituted phthalocyanine and the substituted phthalocyanine are insoluble or slightly soluble. The most preferred poor solvents are water and an aqueous solution mainly containing water because they can keep a high homogeneity of a precipitated composite, are suitable for the fine dispersion (size reduction) step described below, and have a low environmental load.

The composite containing water can be collected through filtration with filter paper and a Buchner funnel in which the acidic solution is removed and rinsing is performed until the filtrate becomes neutral. The collected composite is dehydrated through dewatering and drying. Alternatively, when water or a water-soluble organic solvent is used in the subsequent step, the composite may contain water.

It has been confirmed that the composite of the unsubstituted phthalocyanine and the substituted phthalocyanine obtained in the step (a) has an amorphous form on the basis of an observation result with a transmission electron microscope.

Step (b)

In the step (b), the composite obtained in the step (a) is formed into nanowires by one-dimensional crystal growth. The formation of nanowires is preferably performed such that the resultant nanowires have a width (breadth) of 100 nm or less, and 50 nm or less in view of increasing the photoelectric conversion efficiency.

The process of forming nanowires is not particularly limited as long as the composite can be formed into nanowires. For example, there is a process of forming the composite into nanowires in an organic solvent (liquid phase). Specifically, the composite in an organic solvent (liquid phase) is subjected to stirring (under heating) or standing still (under heating), so that the composite can be formed into nanowires.

In the case of forming the composite into nanowires in an organic solvent (liquid phase), the solvent used is not particularly limited unless it has a low affinity for phthalocyanines. For example, amide solvents and aromatic organic solvents that have a high affinity for phthalocyanines are preferred. Specifically, the most preferred organic solvents having a very high affinity for phthalocyanines are N,N-dimethylacetamide, N,N-dimethylformamide, N-methylpyrrolidone, toluene, xylene, ethylbenzene, chlorobenzene, dichlorobenzene, and the like. The amide organic solvents and the aromatic organic solvents may be used alone. Alternatively, such an amide organic solvent and such an aromatic organic solvent may be used as a mixture in desired proportions and may be further combined with another organic solvent.

Examples of such an organic solvent that can be combined with an amide organic solvent and an aromatic organic solvent include, in view of the capability of promoting formation of nanowires, glycol esters such as ethylene glycol monomethyl ether acetate, propylene glycol monomethyl ether acetate, diethylene glycol monobutyl ether acetate, and diethylene glycol monoethyl ether acetate. Such an organic solvent may be added after the composite is dispersed in an amide organic solvent or an aromatic organic solvent; alternatively, a mixture of such organic solvents is prepared in advance and the composite may be added to and dispersed in the mixture.

As for the amount of an organic solvent added to the composite, in view of achieving an appropriate flowability and suppressing agglomeration, the solid content concentration of the composite with respect to the organic solvent is preferably in the range of 0.1% to 20%, more preferably in the range of 1% to 10%.

The temperature of stirring or standing still for forming the composite into nanowires is preferably in the range of 5° C. to 250° C., more preferably in the range of 20° C. to 200° C. When the temperature is 5° C. or more, crystal growth of phthalocyanines can be sufficiently induced and nanowires can be grown through intended one-dimensional crystal growth. When the temperature is 250° C. or less, agglomeration and fusion of nanowires scarcely occur and formation of coarse crystals due to crystal growth in the width direction does not occur.

The time for which stirring or standing still is performed for the formation of nanowires is not particularly limited. To grow phthalocyanine nanowires to a length of 100 nm or more, stirring or standing still is preferably performed at least for 10 or more minutes.

The composite can be formed into nanowires in a liquid phase by a process in which the composite is simply added to an organic solvent and the resultant solution is subjected to stirring (under heating) or standing still (under heating) to form nanowires, or by a process in which the composite is finely dispersed in an organic solvent and the resultant solution is subjected to stirring (under heating) or standing still (under heating) to form nanowires. In view of formation of ink described below, to simplify the steps of forming ink, preferred is the process in which the composite is finely dispersed in an organic solvent and the resultant solution is subjected to stirring (under heating) or standing still (under heating) to form nanowires.

When the composite is finely dispersed in an organic solvent and the resultant solution is subjected to stirring (under heating) or standing still (under heating) to form nanowires, a process of finely dispersing the composite in an organic solvent may be a wet process of finely dispersing the composite in a liquid phase and a process of forming the composite into fine particles (size reduction) in a gas phase and then dispersing the fine particles in an organic solvent. Of these, the wet dispersion process is preferred because the steps can be simplified.

The wet dispersion process is, for example, a process in which the composite obtained in the step (a) is treated together with a dispersion medium with a wet dispersion apparatus using microbeads, such as a bead mill or a paint conditioner; a process of using a medialess dispersion apparatus represented by T. K. FILMIX manufactured by PRIMIX Corporation; or a process of using an ultrasonic homogenizer or the like to perform a treatment employing high-power ultrasonic radiation. These processes may be used alone or in combination.

Herein, examples of the dispersion medium used in the wet dispersion process include water, an organic solvent, and a water-containing organic solvent. Examples of the organic solvent include the organic solvents used for the formation of nanowires, alcohols such as ethanol, glycols, and glycol esters. These dispersion media may be used alone or in combination. In view of crystal growth or suppression of crystal transition, preferred are water, ethanol, methanol, chlorobenzene, dichlorobenzene, and N-methyl-2-pyrrolidone.

In the wet dispersion process, the mass percentage of the composite with respect to the dispersion medium is not particularly limited; in view of dispersion efficiency, the dispersion process is preferably performed such that the concentration of the solid content is in the range of 1 to 30 mass %. When micromedia such as zirconia beads are used in the dispersion process, the beads preferably have a size in the range of 0.01 to 2 mm in view of the degree to which the composite is finely dispersed. The amount of micromedia used with respect to the dispersion liquid of the composite is most preferably in the range of 100 to 1000 mass % in view of the efficiency of forming fine particles and collection efficiency.

As for the degree of fine dispersion, the wet dispersion process is preferably performed such that the composite has a particle size of less than 1 μm, preferably, in view of promotion of formation of nanowires, less than 500 nm, more preferably less than 300 nm (the particle size is determined by dynamic light scattering).

The wet dispersion process and the formation of nanowires may use different solvents. In such a case, after the wet dispersion process is performed, the solvent used in the wet dispersion is removed and the composite having a reduced size is redispersed in a solvent for formation of nanowires. The process of removing the solvent used in the wet dispersion is not particularly limited and may be, for example, filtration, centrifugal separation, or evaporation with a rotary evaporator or the like. After such a process is performed, drying may be further performed with a vacuum dryer or the like to completely remove the solvent. The process of redispersion in a solvent for formation of nanowires is not particularly limited and may be a publicly known and commonly used process such as a heating process, a stirring process, a dispersion-stirring process, a dispersion-homogenization process, an ultrasonic radiation process, an ultrasonic stirring process, an ultrasonic homogenization process, or an ultrasonic dispersion process. These processes may be used alone or in combination.

Step (c)

Finally, the nanowires obtained in the step (b) are shortened (the aspect ratio is decreased) to form nanorods. The process of forming nanorods is not particularly limited and the nanowires in an organic solvent may be subjected to a process such as a stirring process, a dispersion-stirring process, a dispersion-homogenization process, an ultrasonic radiation process, an ultrasonic stirring process, an ultrasonic homogenization process, an ultrasonic dispersion process, or a laser radiation process. These processes may be used alone or in combination. As a result of such a process, phthalocyanine nanorods are provided that have a breadth of 100 nm or less and a ratio (length/breadth) of a length to the breadth, the ratio being less than 10.

<Production Method (II)>

This production method includes a step of causing a reaction between an isoindoline compound and metal ions in a water-soluble polyhydric alcohol in the presence of a substituted phthalocyanine to provide nanowires, and a step of forming the nanowires into nanorods.

Specifically, in the production method, a substituted phthalocyanine, an isoindoline compound, and metal ions are dissolved in a water-soluble polyhydric alcohol and sufficiently stirred to provide a homogenous mixed solution. When a temperature in the stirring is more than 80° C., there are cases where phthalocyanine crystals having a size beyond the level of nanometers are partially formed before mixing is sufficiently achieved or the yield becomes low. Accordingly, the stirring is preferably performed at 80° C. or less.

The polyhydric alcohol solution containing the substituted phthalocyanine, the isoindoline compound, and the metal ions is mixed at a temperature of 80° C. or less to provide a mixed solution. This mixed solution is then heated to 80° C. to 200° C. under stirring to cause the reaction between the isoindoline compound and the metal ions. Thus, nanowires are obtained. Herein, the temperature in the stirring is preferably 100° C. to 180° C.

Alternatively, a polyhydric alcohol mixture of the isoindoline compound and the metal ions is dropped to a water-soluble polyhydric alcohol solution in which the substituted phthalocyanine has been dissolved. The resultant solution is set in the above-described temperature range to cause the reaction between the isoindoline compound and the metal ions. Thus, nanowires can be obtained.

The mixing ratio of the isoindoline compound and the metal ions is preferably adjusted such that, in view of stoichiometry, the amount of the metal ions is 1 to 4 mol with respect to 4 mol of the isoindoline compound serving as a starting material.

Examples of a water-soluble polyhydric alcohol usable in the present invention include α-glycols such as ethylene glycol, propylene glycol, 1,2-butanediol, and 2,3-butanediol, and glycerin. In particular, water-soluble polyhydric alcohols having a molecular structure in which carbon atoms to which two or three hydroxy groups are bonded are next to each other are preferred.

Examples of a substituted phthalocyanine used in the present invention include compounds that have a phthalocyanine ring substituted with one or more substituents and have solubility in polyhydric alcohols: specifically, compounds represented by the general formula (5) or (6).

In the production method, Z in the general formula (5) or (6) is not particularly limited as long as it is a water-soluble polymer chain having a number-average molecular weight of 1000 or more; Z preferably represents a water-soluble polymer having a number-average molecular weight of 1000 or more and 10000 or less. Such a water-soluble polymer chain is not particularly limited as long as it has water solubility and an affinity for water-soluble polyhydric alcohols. Specifically, the water-soluble polymer chain may be a polymer chain having polyalkylene oxide as a moiety: more specifically, the polymer chain may have any polyalkylene oxide as a moiety such as an ethylene oxide polymer or an ethylene oxide/propylene oxide copolymer and it may be a block copolymer or a random copolymer. Preferably, Z is a polymer chain derived from an alkylene oxide copolymer and is a group represented by the general formula (15), and the hydrophilicity and oleophilicity of the polymer chain are desirably optimized in accordance with solubility in a polyhydric alcohol used.

An isoindoline compound used in the present invention may be synthesized by a publicly known and commonly used method. For example, a phthalonitrile compound such as ortho-phthalonitrile is dissolved in a polyhydric alcohol such as an α-glycol or glycerin by heating, and the reaction between the phthalonitrile compound and the polyhydric alcohol is made to occur in the presence of or absence of an organic base such as 1,2-diazabicyclo(5.4.0)undecene-7 (hereafter, referred to as "DBU") or a metal alkoxide, to synthesize a reaction product (isoindoline compound) between the phthalonitrile compound and the polyhydric alcohol, soluble in a water-soluble polyhydric alcohol.

A phthalonitrile compound usable in the present invention is a compound having two —CN groups at the ortho position of a benzene ring or a naphthalene ring, such as ortho-phthalonitrile. For example, such a compound is represented by the following formula (Chem. 20).

[Chem. 20]

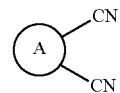

(where the ring A represents a benzene ring or a naphthalene ring that may optionally have a substituent such as an alkyl group, an alkoxy group, an alkylthio group, or a halogen group).

As for the temperature of the reaction between the phthalonitrile compound and the water-soluble polyhydric alcohol, in the case of not adding an organic base or a metal alkoxide, a temperature of 80° C. or more would be OK. However, a metal-free phthalocyanine compound is generated at a high temperature and, if so, a filtration step or the like becomes necessary, which is not preferable. When the temperature is low, the reaction may require a long time. Accordingly, practically, the reaction is preferably performed in the range of 100° C. to 130° C. for 15 minutes to 8 hours, more preferably for 1 to 3 hours. The resultant solution containing an isoindoline compound is preferably cooled to 80° C. or less immediately after the completion of the reaction so that the reaction does not further proceed. During the reaction, entry of water contained in the air is preferably avoided by, for example, performing the reaction in a nitrogen atmosphere. The water-soluble polyhydric alcohol is preferably dewatered in advance.

When an organic base such as DBU is added and the reaction between the phthalonitrile compound and the polyhydric alcohol is performed, the reaction can be performed at a lower temperature than that in the case of not using the organic base, which is advantageous in suppressing generation of metal-free phthalocyanine compounds. Specifically, the reaction is preferably performed in the range of 30° C. to 100° C. for 10 minutes to 2 hours.

The mass percentage of the phthalonitrile compound with respect to the water-soluble polyhydric alcohol in the reaction is not particularly limited. However, when the concentration of the phthalonitrile compound is less than 2%, the productivity of synthesizing a metal phthalocyanine compound later becomes low. When the concentration is more than 40%, the resultant solution has very high viscosity and the amount of metal-free phthalocyanine compounds generated may become large. Accordingly, the concentration of the phthalonitrile compound is preferably in the range of 2 to 40 mass %, in particular, in the range of 5 to 20 mass %.

Examples of metal ions usable in the present invention include all the metal ions that can serve as the central metals of metal phthalocyanines: specifically, copper ions, zinc ions, cobalt ions, nickel ions, tin ions, lead ions, magnesium ions, silicon ions, iron ions, and palladium ions. Such metal ions are generally supplied for the reaction by dissolving a metal salt in the water-soluble polyhydric alcohol. Examples of the salt include halides and sulfates. For example, in the case of copper salts, copper (II) chloride and copper (II) sulfate are preferred.

When the reaction between an isoindoline compound and metal ions is caused in the presence of a substituted phthalocyanine, a glycol solvent may be added to a water-soluble polyhydric alcohol solution containing these compounds and metal ions. In particular, the glycol solvent is preferably a glycol ester solvent in view of affinity for metal phthalocyanine nanowires generated and possible heating temperature. Specifically, a non-limiting example of the solvent is propylene glycol monomethyl ether acetate. The reason why glycol solvents are preferred is that they promote unidirectional crystal growth for forming nanowires of phthalocyanines according to the present invention.

The thus-obtained nanowires are formed into nanorods as in the step (c) of the production method (I).

<Production Method (III)>

In the step (b) of the production method (I), the one-dimensional crystal growth of the composite obtained in the step (a) is monitored over time, and this step is finished before the aspect ratio becomes 10 or more (formation of wires). Thus, nanorods having an aspect ratio of less than 10 can be obtained.

The production method (I) is preferred among the above-described methods (I) to (III) for producing phthalocyanine nanorods in the present invention.

(Ink Composition or Material for Photoelectric Conversion Device)

An ink composition (or a material for a photoelectric conversion device) according to the present invention contains phthalocyanine nanorods having a breadth of 100 nm or less and a ratio (length/breadth) of a length to the breadth, the ratio being less than 10.

By dispersing the phthalocyanine nanorods in an organic solvent, an ink composition (or a material for a photoelectric conversion device) suitable for a wet process (printing or coating) is provided.

The type of the organic solvent is not particularly limited as long as the organic solvent allows stable dispersion of phthalocyanine nanorods therein. A single organic solvent or a mixture of two or more organic solvents may be used. In view of allowing for sufficient and stable dispersion of phthalocyanine nanorods, amide solvents are preferred: specifically, N,N-dimethylacetamide, N,N-dimethylformamide, N-methylpyrrolidone, N,N-diethylformamide, and the like. Of these, N-methylpyrrolidone is particularly preferred.

The solvent forming an ink composition (or a material for a photoelectric conversion device) can be appropriately selected depending on the type of a substituted phthalocyanine contained in phthalocyanine nanorods. For example, preferred examples of an organic solvent in which phthalocyanine nanorods containing the derivative represented by (Chem. 10) can be sufficiently and stably dispersed include, in addition to amide solvents, aromatic solvents, halogenated aromatic organic solvents, and halogenated organic solvents. Specific examples of the aromatic solvents include toluene, xylene, and ethylbenzene. Specific examples of the halogenated aromatic organic solvents include chlorobenzene and dichlorobenzene.

Examples of the halogenated organic solvents include chloroform, methylene chloride, and dichloroethane. Of these, particularly preferred is dichlorobenzene.

In an ink composition (or a material for a photoelectric conversion device) according to the present invention, to impart suitability for a wet process (printing or coating) or film-formation capability (film quality after printing or coating), the content of phthalocyanine nanorods in the composition is preferably 0.05 to 20 mass %, in particular, preferably 0.1 to 10 mass %.

An ink composition (or a material for a photoelectric conversion device) according to the present invention may contain, in addition to phthalocyanine nanorods, another electron-donating material or a hole-transporting material. Examples of such materials include π-conjugated polymers, semiconducting non-π-conjugated polymers, and low-molecular-weight organic semiconductor compounds. Examples of the π-conjugated polymers include polythiophenes, poly-p-phenylenevinylenes, poly-p-phenylenes, polyfluorenes, polypyrroles, polyanilines, polyacetylenes, and polythienylenevinylenes. An example of the semiconducting non-π-conjugated polymers is polyvinylcarbazole. Examples of the low-molecular-weight organic semiconductor compounds include soluble or solvent dispersible phthalocyanine derivatives and soluble or solvent dispersible porphyrin derivatives. Of these, the polymer materials also have the effect of imparting suitability for a wet process (printing or coating) and film-formation capability (film quality after printing or coating) to the ink composition (or a material for a photoelectric conversion device) as described below.

An ink composition (or a material for a photoelectric conversion device) according to the present invention may contain an electron-accepting material represented by a fullerene. As a result, a photoelectric conversion layer can be formed by one-time film formation. Examples of an electron-accepting material usable in the present invention include naphthalene derivatives, perylene derivatives, oxazole derivatives, triazole derivatives, phenanthroline derivatives, phosphine oxide derivatives, fullerenes, carbon nanotubes (CNT), modified graphenes, derivatives such as CN-PPV which is obtained by introducing cyano groups into poly-p-phenylenevinylene, Boramer (trade name, manufactured by TDA Research, Inc.), and publicly known and commonly used low- or high-molecular-weight organic semiconductor materials to which CF3 groups or F groups have been introduced. Examples of the naphthalene derivatives include 1,4, 5,8-naphthalenetetracarboxylic diimide (NTCDI), N,N'-dialkyl-1,4,5,8-naphthalenetetracarboxylic diimide (NTCDI-R) (R represents an alkyl group having 1 to 20 carbon atoms), and 1,4,5,8-naphthalenetetracarboxylic dianhydride (NTCDA). Examples of the perylene derivatives include 3,4, 9,10-perylenetetracarboxylic dianhydride (PTCDA), 3,4,9, 10-perylenetetracarboxylic bisbenzimidazole (PTCBI), 3,4, 9,10-perylenetetracarboxylic diimide (PTCDI), and N,N'-dialkyl-3,4,9,10-perylenetetracarboxylic diimide (PTCDI-R) (R represents an alkyl group having 1 to 20 carbon atoms). Examples of the oxazole derivatives include 2-(4-biphenylyl)-5-(4-t-butylphenyl)-1,3,4-oxadiazole (PBD) and 2,5-di (1-naphthyl)-1,3,4-oxadiazole (BND). Examples of the triazole derivatives include 3-(4-biphenylyl)-4-phenyl-5-(4-t- butylphenyl)-1,2,4-triazole (TAZ). Examples of the phenanthroline derivatives include bathocuproin (BCP) and bathophenanthroline (Bphen). Examples of the fullerenes include unsubstituted fullerenes such as C60, C70, C76, C78, C82, C84, C90, and C94; [6,6]-phenyl-C61-butyric acid methyl ester (PCBM), [5,6]-phenyl-C61-butyric acid methyl ester ([5,6]-PCBM), [6,6]-phenyl-C61-butyric acid hexyl ester ([6,6]-PCBH), [6,6]-phenyl-C61-butyric acid dodecyl ester ([6,6]-PCBD), phenyl-C71-butyric acid methyl ester (PC70BM), and phenyl-C85-butyric acid methyl ester (PC84BM). Of these, fullerenes, which have a high charge separation rate and a high electron transfer rate, are preferably used. Among fullerenes, PCBM and C70 derivatives (the above-described PC70BM and the like) are more preferred because they are excellent in charge separation rate and electron transfer rate and higher photoelectric conversion efficiency can be achieved.

Among the electron-accepting materials, polymer materials (electron-accepting polymers) such as Boramer (trade name, manufactured by TDA Research, Inc.) and derivatives obtained by introducing cyano groups into poly-p-phenylenevinylene (CN-PPV) are preferred because they have, in addition to a semiconducting function of charge separation and electron transfer, the effect of imparting suitability for a wet process (printing or coating) and film-formation capability (film quality after printing or coating) to the ink composition (or a material for a photoelectric conversion device).

In an ink composition (or a material for a photoelectric conversion device) according to the present invention, the mixing ratio of phthalocyanine nanorods to an electron-accepting material can be freely selected as long as a photoelectric conversion device described below has photoelectric conversion characteristics; however, the phthalocyanine nanorods/electron-accepting material is preferably in the range of 1/99 to 99/1, more preferably in the range of 1/9 to 9/1, and still more preferably in the range of 2/8 to 8/2.

In an ink composition (or a material for a photoelectric conversion device) according to the present invention, when an electron-accepting material is added, the total content of the phthalocyanine nanorods and the electron-accepting material with respect to the solvent is preferably 0.05 to 20 mass %, particularly preferably 0.1 to 10 mass %.

To impart suitability for a wet process (printing or coating) and film-formation capability (film quality after printing or coating) to an ink composition (or a material for a photoelectric conversion device) according to the present invention, a resin component can be added as a rheological control component or a binder component to the ink composition. The resin is not particularly limited as long as it is a publicly known and commonly used resin. A single resin or two or more resins in combination may be used. Preferred examples of such resins include polymethyl methacrylate, polystyrene, and polycarbonate.

When the content of such a resin is excessively high, the viscosity excessively increases, which influences film-formation capability in printing or coating. Also, since polymethyl methacrylate, polystyrene, polycarbonate, and the like are electrically inactive, an excessively high content of such a resin results in a relative decrease in the concentrations of the electron-donating material and the electron-accepting material. Thus, the photoelectric conversion characteristics exhibited by the electron-donating material and the electron-accepting material are degraded. Accordingly, the content of a resin in the ink composition (or a material for a photoelectric conversion device) is preferably 20 mass % or less, more preferably 10 mass % or less.

In an ink composition (or a material for a photoelectric conversion device) according to the present invention, a dispersoid component and various surfactants and the like may be optionally added for the purpose of mainly enhancing suitability for a wet process (printing or coating) and film-formation capability (film quality after printing or coating).

The dispersoid component may be a publicly known and commonly used single fine powder that can maintain photoelectric conversion characteristics; or a dispersion liquid obtained by dispersing such a single fine powder in a dispersing agent or an organic solvent in advance. Such dispersoid components may be used alone or in combination of two or more thereof. Non-limiting specific examples include AEROSIL series (trade name, manufactured by Evonik Industries); Sylysia, Sylophobic, Sylopute, Sylopage, Sylopure, Sylosphere, Sylomask, Silwell, and Fuji Balloon (trade names, manufactured by FUJI SILYSIA CHEMICAL LTD.); PMA-ST and IPA-ST (trade names, manufactured by Nissan Chemical Industries, Ltd.); and NANOBIC 3600 series and NANOBIC 3800 series (trade names, manufactured by BYK Japan KK). These examples may be used alone or in combination of two or more thereof. Since a photoelectric conversion device is configured to transport charge in the film thickness direction, the film needs to have surface smoothness. Accordingly, a dispersoid component added to the ink preferably has an average particle size of 1 to 150 nm, more preferably 5 to 50 nm, preferably PMA-ST and IPA-ST (trade names, manufactured by Nissan Chemical Industries, Ltd.) and NANOBIC 3600 series (trade name, manufactured by BYK Japan KK), which are dispersion liquids of silica fine particle and alumina fine particles. The average particle size can be readily measured by, for example, a dynamic light scattering method. Since such a dispersoid component is electrically inactive, an excessively high content of such a dispersoid component results in a relative decrease in the concentrations of the electron-donating material and the electron-accepting material. Thus, the photoelectric conversion characteristics exhibited by the electron-donating material and the electron-accepting material are degraded. Accordingly, the content of a dispersoid component with respect to the entire solid content of an ink composition (or a material for a photoelectric conversion device) is 90 mass % or less, preferably 70 mass % or less.

Examples of the surfactants include hydrocarbon-based surfactants, silicon-based surfactants, and fluorine-based surfactants. These surfactants may be used alone or in combination of two or more thereof. In particular, preferred are nonionic fluorine-based surfactants having a linear perfluoroalkyl group and a chain length corresponding to 6 or more carbon atoms; more preferably 8 or more carbon atoms. Non-limiting specific examples include MEGAFACE F-482, MEGAFACE F-470 (R-08), MEGAFACE F-472SF, MEGAFACE R-30, MEGAFACE F-484, MEGAFACE F-486, MEGAFACE F-172D, and MEGAFACE F178RM (trade names, manufactured by DIC Corporation). These surfactants may be used alone or in combination of two or more thereof. The content of such a surfactant in an ink composition (or a material for a photoelectric conversion device) is 5.0 mass % or less in terms of active component, preferably 1.0 mass % or less in terms of active component.

In an ink composition (or a material for a photoelectric conversion device) according to the present invention, the above-described materials are mixed. The mixing method is not particularly limited. For example, the above-described materials in desired proportions are added to a solvent and the materials are subsequently dispersed in and mixed with the solvent by one or more publicly known and commonly used methods selected from a heating process, a stirring process, a dispersion-stirring process, a dispersion-homogenization process, an ultrasonic radiation process, an ultrasonic stirring process, ultrasonic homogenization, an ultrasonic dispersion process, a laser radiation process, and the like.

(Photoelectric Conversion Device)

Hereinafter, a photoelectric conversion device according to the present invention will be described. A photoelectric conversion device according to the present invention at least includes a pair of electrodes, that is, a positive electrode and a negative electrode, and includes phthalocyanine nanorods according to the present invention embedded between the electrodes. FIG. 1 is a schematic view of an embodiment of a photoelectric conversion device according to the present invention. In FIG. 1, the reference sign 1 denotes a substrate; the reference sign 2 denotes an electrode a; the reference sign 3 denotes a photoelectric conversion layer (organic semiconductor layer) containing phthalocyanine nanorods according to the present invention; and the reference sign 4 denotes an electrode b.

The organic semiconductor layer 3 is a film containing phthalocyanine nanorods according to the present invention. The organic semiconductor layer 3 is a film formed from an ink composition (or a material for a photoelectric conversion device) according to the present invention.

Figure 2:
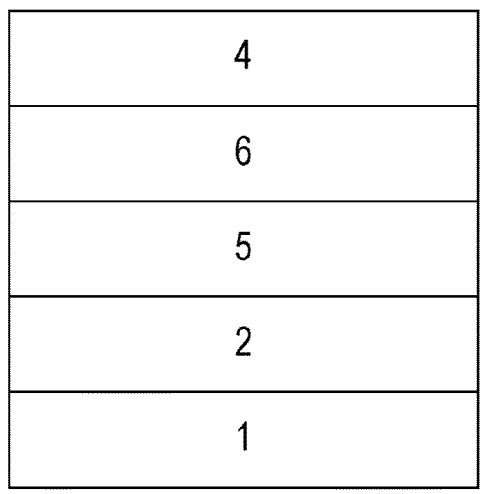
FIG. 2 is a schematic sectional view of a photoelectric conversion device according to the present invention.

When the organic semiconductor layer 3 contains an electron-accepting material, phthalocyanine nanorods according to the present invention and the electron-accepting material may be mixed or form a multilayer structure. An example of the multilayer structure is illustrated in FIG. 2. A layer containing phthalocyanine nanorods according to the present invention serving as an electron-donating material is preferably positioned so as to be close to the positive electrode and a layer containing the electron-accepting material is preferably positioned so as to be close to the negative electrode. Thus, in FIG. 2, when the reference sign 5 denotes the layer containing phthalocyanine nanorods according to the present invention and the reference sign 6 denotes the layer containing the electron-accepting material, the electrode a denoted by the reference sign 2 is the positive electrode and the electrode b denoted by the reference sign 4 is the negative electrode. Note that, in the case of the multilayer structure, "an electron-donating material other than the phthalocyanine nanorods" may be contained in the layer containing phthalocyanine nanorods according to the present invention (reference sign 5) or the layer containing the electron-accepting material (reference sign 6).

The thickness of the organic semiconductor layer (reference sign 3 in FIG. 1; and reference signs 5 and 6 in FIG. 2) is not particularly limited as long as, in the organic semiconductor layer, light absorption is sufficiently achieved and charge deactivation does not occur. The thickness is preferably in the range of 5 to 1000 nm, more preferably in the range of 10 to 500 nm, still more preferably in the range of 20 to 300 nm. In the case of the multilayer structure, within the above-described thickness, the layer containing phthalocyanine nanorods according to the present invention preferably has a thickness of 1 to 500 nm, more preferably 5 to 300 nm.

The organic semiconductor layer can be obtained by forming a film of an ink composition (or a material for a photoelectric conversion device) according to the present invention by a wet process (printing or coating) and drying the film. A method for forming a film of an ink composition (or a material for a photoelectric conversion device) according to the present invention is not particularly limited and may be a publicly known and commonly used method. Specific examples of the method include an ink jet printing method, a gravure printing method, a gravure offset printing method, an offset printing method, a letterpress printing method, a letterpress reverse printing method, a screen printing method, a micro contact printing method, a reverse coater method, an air doctor coater method, a blade coater method, an air knife coater method, a roll coater method, a squeeze coater method, an impregnated coater method, a transfer roll coater method, a kiss coater method, a cast coater method, a spray coater method, an electrostatic coater method, an ultrasonic spray coater method, a die coater method, a spin coater method, a bar coater method, a slit coater method, and a drop cast method.

When the organic semiconductor layer is formed so as to have a multilayer structure as illustrated in FIG. 2, a film of a material (containing phthalocyanine nanorods) for a photoelectric conversion device according to the present invention is formed by such a method described above and a film of an electron-accepting material may be subsequently formed thereon by a publicly known and commonly used method as in the film formation of a buffer layer described below. Note that phthalocyanine nanorods according to the present invention in the formed film gain solvent resistance and hence the electron-accepting material can be formed thereon by a wet process.

Examples of the material of the substrate 1 include silicon, glass, and various resin materials. Examples of the various resin materials include polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), cellulose acetate propionate (CAP), and acrylic resins. By using such a resin material, lightweight, high portability, and high impact resistance can be achieved, compared with the cases of using glass.

In the case that the light is applied from the substrate side, a material having a high light transmittance is preferred. Examples of such a material include glass, PET, PC, polyimide, PES, and acrylic resins.

As for materials for the electrodes a and b, a conductive material having a high work function is preferably used for one of the electrodes and a conductive material having a low work function is preferably used for another one of the electrodes. The electrode formed of a conductive material having a high work function serves as a positive electrode. Preferred examples of the conductive material having a high work function include metals such as gold, platinum, chromium, and nickel; transparent oxides of metals such as indium and tin; transparent composite oxides of metals such as indium and tin (indium tin oxide (ITO), indium zinc oxide (IZO), fluorine-doped tin oxide (FTO)); (multilayer) graphene; (multilayer) modified graphene; and publicly known general conductive polymers whose conductivity has been increased by doping (conductive polyaniline, conductive polypyrrole, conductive polythiophene, and polyethylene dioxythiophene (PEDOT)). A conductive material used for the positive electrode is preferably a material that forms ohmic contact with the organic semiconductor layer 3. When a buffer layer 1 is used as described below, a conductive material used for the positive electrode is preferably a material that forms ohmic contact with the buffer layer 1.

The electrode formed of a conductive material having a low work function serves as a negative electrode. Examples of such a conductive material having a low work function include alkali metals and alkaline-earth metals: specifically, lithium, magnesium, calcium, and the like. The examples further include tin, silver, and aluminum, which are preferably used. An electrode formed of an alloy of such metals or constituted by a stack of layers formed of such metals is preferably used. A conductive material used for the negative electrode is preferably a material that forms ohmic contact with the organic semiconductor layer 3. When a buffer layer 2 is used as described below, a conductive material used for the negative electrode is preferably a material that forms ohmic contact with the buffer layer 2.

In a photoelectric conversion device according to the present invention, one of the electrodes a and b preferably has optical transparency. The optical transparency of such an electrode is not particularly limited as long as it allows incident light to reach the organic semiconductor layer 3 to generate an electromotive force. Preferred examples of such a conductive material among the above-described conductive materials include ITO (indium oxide-tin oxide composite); FTO (fluorine-doped tin oxide); (multilayer) graphene; (multilayer) modified graphene; and publicly known general conductive polymers whose conductivity has been increased by doping (for example, conductive polyaniline, conductive polypyrrole, conductive polythiophene, and polyethylene dioxythiophene (PEDOT)). Such a material may be combined with a mesh formed of a metal material having a high conductivity.

The thickness of an electrode should be in a range in which the electrode has optical transparency and conductivity. The thickness varies depending on electrode materials, and it is preferably 5 to 10000 nm, preferably 10 to 5000 nm, still more preferably 20 to 300 nm. As for the other electrode, although conductivity is required, optical transparency is not necessarily indispensable and the thickness is not particularly limited.

The electrodes can be formed from the above-described materials serving as raw materials by a method appropriately selected in accordance with the materials. Examples of the method include dry processes such as a vacuum deposition method, a molecular beam epitaxy method, an ion cluster beam method, a low-energy ion beam method, an ion plating method, a CVD method, a sputtering method, and an atmospheric-pressure plasma method; and wet processes such as an ink jet printing method, a gravure printing method, a gravure offset printing method, an offset printing method, a letterpress printing method, a letterpress reverse printing method, a screen printing method, a micro contact printing method, a reverse coater method, an air doctor coater method, a blade coater method, an air knife coater method, a roll coater method, a squeeze coater method, an impregnated coater method, a transfer roll coater method, a kiss coater method, a cast coater method, a spray coater method, an electrostatic coater method, an ultrasonic spray coater method, a die coater method, a spin coater method, a bar coater method, a slit coater method, and a drop cast method. Specifically, examples of the method include: a method in which an electrode is formed through a pattern mask by a dry process such as vapor deposition or sputtering; a method in which a conductive solid film formed by a dry process such as vapor deposition or sputtering is formed into an electrode by a publicly known and commonly used photolithographic process and etching process; a method of forming an electrode by a dry process such as vapor deposition or sputtering and a photolithographic process and liftoff process; and a method in which a conductive solid film formed by a dry process such as vapor deposition or sputtering is etched through resist formed with an ink jet or the like. A pattern may be directly formed from a conductive fine particle dispersion liquid, a conductive polymer solution, or a conductive polymer dispersion liquid by a wet process such as an ink jet printing method, a screen printing method, a gravure offset printing method, a letterpress reverse printing method, or a micro contact printing method. Alternatively, a solid film may be formed by coating and then patterned by a publicly known and commonly used method such as a photolithographic-etching process or a laser ablation method. Alternatively, a pattern may be formed by a wet process and a photolithographic process and liftoff process.

In the present invention, the buffer layer 1 may be formed between the positive electrode and the organic semiconductor layer. The buffer layer 1 is optionally used for allowing efficient charge extraction. Preferred examples of a material for forming the buffer layer 1 include graphene oxide, modified graphene, polythiophenes, poly-p-phenylenevinylenes, polyfluorenes, and polyvinylcarbazoles, phthalocyanine derivatives (H2Pc, CuPc, ZnPc, and the like), and porphyrin derivatives. Such materials may be doped to increase conductivity (hole-transporting property). In particular, polyethylene dioxythiophene (PEDOT), which is a polythiophene, and PEDOT:PSS obtained by doping PEDOT with polystyrene sulfonate (PSS) are preferably used. The buffer layer 1 preferably has a thickness of 5 to 600 nm, more preferably 10 to 200 nm.

In the present invention, the buffer layer 2 may be formed between the organic semiconductor layer and the negative electrode. The buffer layer 2 is optionally used for allowing efficient charge extraction. Examples of a material for forming the buffer layer 2 include: in addition to the above-described electron-accepting materials (naphthalene derivatives, perylene derivatives, oxazole derivatives, triazole derivatives, phenanthroline derivatives, phosphine oxide derivatives, fullerenes, carbon nanotubes (CNT), modified graphenes, derivatives such as CN-PPV which is obtained by introducing cyano groups into poly-p-phenylenevinylene, Boramer (trade name, manufactured by TDA Research, Inc.), and publicly known and commonly used low- or high-molecular-weight organic semiconductor materials to which CF3 groups or F groups have been introduced), octaazaporphyrin; perfluoro compounds such as perfluoropentacene and perfluorophthalocyanine; charge-transfer complexes composed of an electron-donating compound such as tetrathiofulvalene or tetramethylphenylenediamine and an electron-accepting compound such as tetracyanoquinodimethane or tetracyanoethylene; n-type inorganic oxide semiconductors such as titanium oxide, zinc oxide, and gallium oxide; and alkali metal compounds such as lithium fluoride, sodium fluoride, and cesium fluoride. The buffer layer 2 preferably has a thickness of 0.5 to 600 nm, more preferably 1 to 200 nm.

Examples of a method for forming such buffer layers include dry processes such as a vacuum deposition method, a molecular beam epitaxy method, an ion cluster beam method, a low-energy ion beam method, an ion plating method, a CVD method, a sputtering method, and an atmospheric-pressure plasma method; and wet processes such as an ink jet printing method, a gravure printing method, a gravure offset printing method, an offset printing method, a letterpress printing method, a letterpress reverse printing method, a screen printing method, a micro contact printing method, a reverse coater method, an air doctor coater method, a blade coater method, an air knife coater method, a roll coater method, a squeeze coater method, an impregnated coater method, a transfer roll coater method, a kiss coater method, a cast coater method, a spray coater method, an electrostatic coater method, an ultrasonic spray coater method, a die coater method, a spin coater method, a bar coater method, a slit coater method, and a drop cast method. Such a method can be appropriately used in accordance with a material.

When an inorganic oxide is used to form a buffer layer, the following wet process may be used: a method in which fine particles of an inorganic oxide are dispersed in a desired organic solvent or water optionally with a dispersing auxiliary such as a surfactant to provide a dispersion liquid and the dispersion liquid is applied and dried; or the so-called sol-gel process in which a solution of an oxide precursor such as an alkoxide is applied and dried.

Such a buffer layer may be constituted by a single layer or a multilayer in which layers formed of different materials are laminated.

Photoelectric conversion devices according to the present invention may be integrated to constitute a solar-cell module. In this case, photoelectric conversion devices according to the present invention may be made to have a configuration in which the photoelectric conversion devices are shielded from the water-containing air with a protective sheet or an adhesive sealing material. An example of a solar-cell module has a configuration in which photoelectric conversion devices according to the present invention are integrated in series: the electrode a of a photoelectric conversion device according to the present invention and the electrode b of a neighboring photoelectric conversion device according to the present invention are brought into contact with each other to achieve series connection of the photoelectric conversion devices according to the present invention.

Another example of a solar-cell module has a configuration in which photoelectric conversion devices according to the present invention are integrated through parallel connection: the electrodes a of neighboring photoelectric conversion devices according to the present invention are brought into contact with each other and the electrodes b of neighboring photoelectric conversion devices according to the present invention are brought into contact with each other.

EXAMPLES

Hereinafter, the present invention will be specifically described with reference to Examples. However, the present invention is not limited to the following Examples.

Example 1

Production of Ink Composition (Photoelectric Conversion Device Material)

Step (a)

A concentrated sulfuric acid solution was prepared by adding and completely dissolving 1.6 g of copper phthalocyanine (Fastogen Blue 5380E (trade name, manufactured by DIC Corporation)), which is an unsubstituted phthalocyanine, and 1.2 g of a phthalocyanine derivative represented by (Chem. 10), which is a substituted phthalocyanine, in 81 g of concentrated sulfuric acid (manufactured by KANTO CHEMICAL CO., INC.). Subsequently, 730 g of distilled water was poured into a 1000-mL beaker and sufficiently cooled with ice water. The prepared concentrated sulfuric acid solution was then added to the distilled water under stirring to precipitate a composite of the unsubstituted copper phthalocyanine and the copper phthalocyanine derivative represented by (Chem. 10).

The obtained composite was then collected in the form of a water-containing composite by filtration through filter paper and sufficient rinsing with distilled water.

Step (b)

The water-containing composite (12 g) obtained in the step (a) was placed in a polypropylene vessel having a volume of 50 mL. In this vessel, distilled water was added such that the weight percentage of the composite (solid content) with respect to water was 15%; and 60 g of zirconia beads having a size of 0.5 mm were added. The resultant solution was treated with a paint shaker for 2 hours to finely disperse the composite. The dispersion liquid of the composite formed into fine particles by the fine dispersion treatment was subsequently separated and collected from the zirconia beads. To this dispersion liquid of the composite, distilled water was added to provide an aqueous dispersion (weight: 50 g, solid content concentration: 5%) of the composite fine particles.

Subsequently, to 10 g of the aqueous dispersion of the composite fine particles, 0.5 g of a 5 N aqueous hydrochloric acid (manufactured by Wako Pure Chemical Industries, Ltd.) was added. The resultant mixture was subjected to centrifugal separation at 2000 rpm for an hour and, as a result, the composite fine particles precipitated. The supernatant liquor, the aqueous hydrochloric acid, was removed. To the water-containing composite fine particles, 4.5 g of N-methylpyrrolidone (NMP) (manufactured by Wako Pure Chemical Industries, Ltd.) was added. The resultant solution was sufficiently shaken and poured into a 100-mL recovery flask. To this flask, 5.0 g of ethylene glycol monomethyl ether acetate (manufactured by Wako Pure Chemical Industries, Ltd.) was further added. The resultant solution was stirred for an hour and then heated with an oil bath to 145° C. over 90 minutes. After the temperature of the solution became 145° C., the solution was kept under heating at this temperature for 30 minutes.

Figure 3:
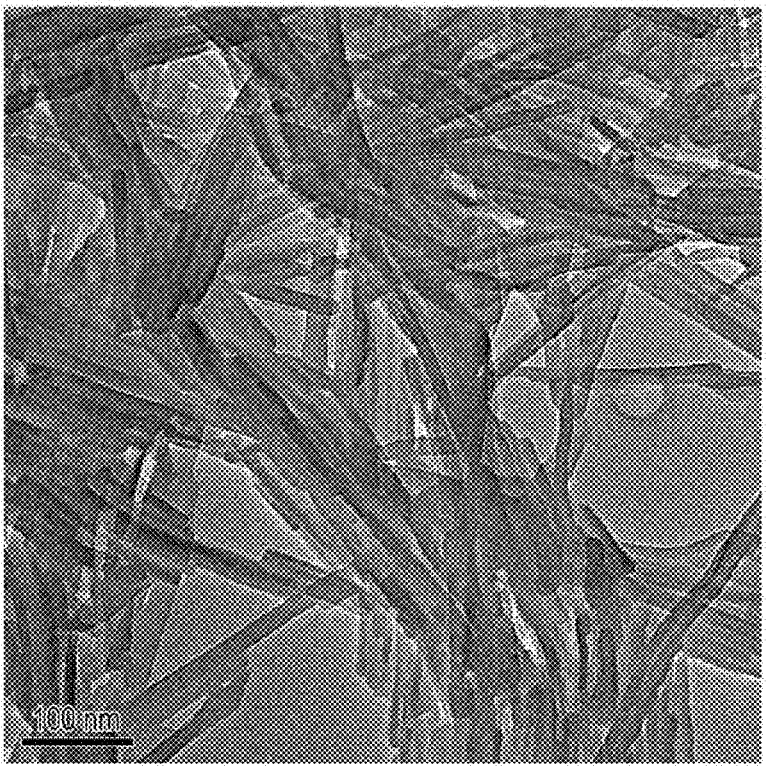
FIG. 3 is a micrograph image of phthalocyanine nanowires magnified with a transmission electron microscope.

The dispersion liquid was then cooled and subsequently filtrated through a membrane filter (pore size: 0.1 µm) and the filtration residue was sufficiently washed with ortho-dichlorobenzene. The filtration residue was added to ortho-dichlorobenzene such that the solid content concentration was 2%. This solution was sufficiently shaken to provide a dispersion liquid containing ortho-dichlorobenzene as a dispersion medium. The solid content of the dispersion liquid was observed with a transmission electron microscope and a wire-shaped solid substance (nanowires) whose breadth was about 50 nm or less and whose ratio of the length to the breadth was 10 or more (refer to FIG. 3) was observed. The solid content was subjected to XRD measurement and a peak derived from phthalocyanine crystals was observed. Thus, generation of phthalocyanine nanowires having a size on the order of nanometers and formed by one-dimensional crystal growth of phthalocyanines was demonstrated.

Step (c)

Figure 4:
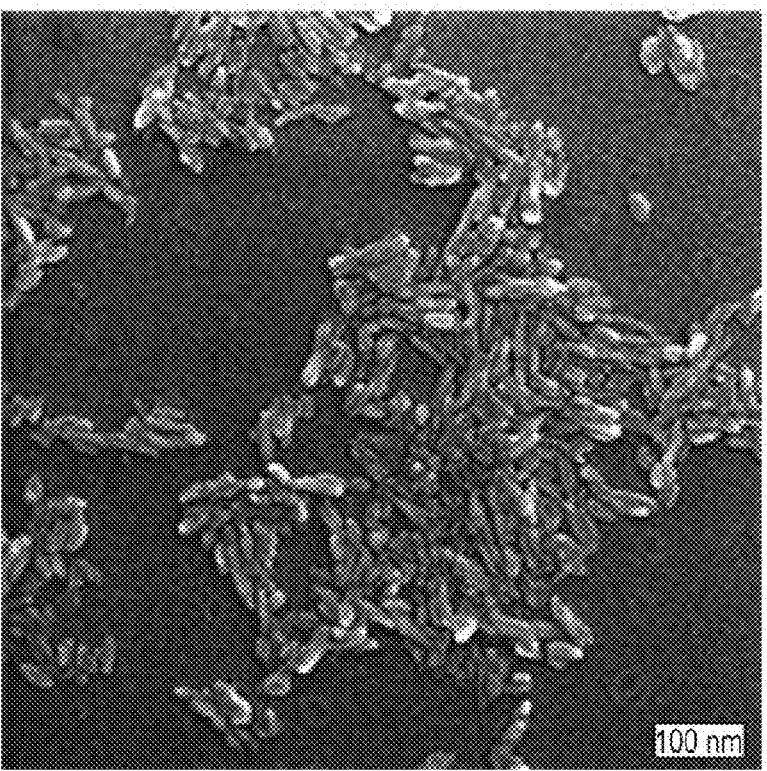
FIG. 4 is a micrograph image of phthalocyanine nanorods magnified with a scanning electron microscope.

The dispersion liquid of the phthalocyanine nanowires obtained in the step (b) was treated under ice cooling with an ultrasonic homogenizer (trade name: US300, manufactured by NIHONSEIKI KAISHA LTD.) employing a 7φ horn at a power of 10 for 30 minutes. The resultant dispersion liquid was collected and the solid content thereof was observed with a scanning electron microscope. As a result, a rod-shaped solid substance whose breadth was about 20 nm or less and whose ratio of the length to the breadth was 5 or less (refer to FIG. 4) was observed. Thus, the formation of nanorods (formation of phthalocyanine nanorods) from phthalocyanine nanowires by the treatment was demonstrated. Thus, in this step, a phthalocyanine nanorod dispersion liquid (1) having a solid content concentration of 2% was produced.

The phthalocyanine nanorod dispersion liquid (1) (150 mg), 45 mg of PCBM (manufactured by Frontier Carbon Corporation), and 200 mg of ortho-dichlorobenzene were added to a sample vial. This sample vial was subjected to ultrasonic waves for 30 minutes in an ultrasonic cleaner (47 kHz). Thus, a photoelectric conversion device material (1) was obtained.

<Production of Photoelectric Conversion Device>

An ITO transparent conductive layer having a thickness of 100 nm and serving as a positive electrode was deposited on a glass substrate by a sputtering method. The ITO transparent conductive layer was patterned so as to have the shape of a strip having a width of 2 mm by a photolithographic-etching process. The resultant glass substrate having an ITO pattern was subjected to ultrasonic cleanings with a neutral detergent, distilled water, acetone, and ethanol in this order: for each of these solutions, three-time cleanings for 15 minutes. The glass substrate was then subjected to an UV/ozone treatment for 30 minutes. A PEDOT:PSS aqueous dispersion (AI4083 (trade name, manufactured by H.C. Starck GmbH)) was applied by spin-coating to form a buffer layer 1 composed of PEDOT:PSS and having a thickness of 60 nm on the ITO transparent electrode layer. The resultant substrate was dried on a hot plate heated at 100° C. for 5 minutes. The photoelectric conversion layer material (1) was applied by spin-coating on the PEDOT:PSS layer to form an organic semiconductor layer having a thickness of 100 nm and stemming from the photoelectric conversion layer material (1). After that, the "substrate having the organic semiconductor layer" and a metal mask for vapor deposition (for forming a strip pattern having a width of 2 mm) were placed in a vacuum deposition apparatus. After the degree of vacuum in the apparatus was increased to $5 \times 10^{-4}$ Pa, aluminum was vapor-deposited so as to form a negative electrode having a strip pattern having a width of 2 mm (film thickness: 80 nm) by a resistance heating method. Thus, a photoelectric conversion device (1) having an area of 2 mm×2 mm (region where the strip-shaped ITO layer intersects the strip-shaped aluminum layer) was produced.

<Evaluation of Photoelectric Conversion Device>

The positive electrode and negative electrode of the photoelectric conversion device (1) were connected to a Digital Multimeter (6241A, trade name (manufactured by ADC CORPORATION)). The current of the photoelectric conversion device (1) was measured while voltage was swept from −0.1 V to +0.8 V in the air under irradiation (from ITO-layer side) with artificial sunlight (simple solar simulator XES151S (trade name, manufactured by SAN-EI ELECTRIC CO., LTD.; spectrum shape: AM 1.5; irradiation intensity: 100 mW/cm$^2$)). At this time, the short-circuit current density (current density at an applied voltage of 0 V, hereafter referred to as $J_{sc}$) was 4.47 mA/cm$^2$; the open-circuit voltage (applied voltage at a current density of 0, hereafter referred to as $V_{oc}$) was 0.56 V; the fill factor (FF) was 0.40; and the photoelectric conversion efficiency (PCE) calculated from these values was 1.02%. Note that FF and PCE were calculated with the following formulae.

$$FF = JV_{max}/(J_{sc} \times V_{oc})$$

(where $JV_{max}$ represents the product of current density and applied voltage at the point where the product of current density and applied voltage has the maximum value while the applied voltage is 0 V to the open-circuit voltage.)

$$PCE = [(J_{sc} \times V_{oc} \times FF)/\text{artificial-sunlight intensity (100 mW/cm}^2\text{)}] \times 100(\%)$$

Example 2

Production of Photoelectric Conversion Device

The dispersion liquid (1) (180 mg) obtained in EXAMPLE (1) was mixed with 180 mg of ortho-dichlorobenzene to provide an ink composition (2) (photoelectric conversion device material (2)).

A photoelectric conversion device (2) was produced as in EXAMPLE (1) except that the photoelectric conversion device material (2) was used instead of the photoelectric conversion device material (1) to form an organic semiconductor layer (electron-donating material layer) stemming from the photoelectric conversion device material (2) as in EXAMPLE (1), and an electron-accepting material layer was formed thereon by spin-coating with 2 wt % PCBM-ortho-dichlorobenzene.

<Evaluation of Photoelectric Conversion Device>

Evaluation of the photoelectric conversion device was performed as in EXAMPLE 1 except that the photoelectric conversion device (2) was used instead of the photoelectric conversion device (1). As a result, $J_{sc}$ was 4.25 mA/cm$^2$; $V_{oc}$ was 0.53 V; FF was 0.44; and PCE calculated from these values was 0.99%.

Example 3

Production of Transistor

An n-type silicon substrate was prepared and this was used as a gate electrode. The surface layer of this substrate was thermally oxidized to form a gate insulating film composed of silicon oxide. To this film, the ink composition (2) obtained in EXAMPLE (2) was applied by spin-coating to form a semiconductor film (channel region). Source and drain electrodes constituted by gold thin films were formed by patterning a deposited film. Thus, a transistor (3) was produced. The channel length L (gap between source electrode and drain electrode) was 75 μm and the channel width W was 5.0 mm.

<Evaluation of Transistor>

The transistor (3) was evaluated in terms of transistor characteristics. The transistor characteristics were evaluated with a Digital Multimeter (SMU237, manufactured by Keithley Instruments, Inc.) by measuring the current (Id) between the source electrode and the drain electrode under the application of −80 V while the voltage (Vg) applied to the gate electrode was swept from 0 to −80 V. As a result, the mobility was $10^{-4}$ and the ON/OFF ratio was $10^4$. The mobility was determined from the slope of $\sqrt{Id}-Vg$ by the well-known method; and the unit is cm$^2$/V·s. The ON/OFF ratio was determined as (maximum of absolute value of Id)/(minimum of absolute value of Id).

Example 4

Production of Ink Composition (Photoelectric Conversion Device Material)

To a mixture of 692 parts by mass of a primary-amine-terminated poly(ethylene oxide/propylene oxide) copolymer (Surfonamine B-200 (trade name, manufactured by Huntsman Corporation)) having a number-average molecular weight of about 2,000, 66 parts by mass of sodium carbonate, and 150 parts by mass of water, 210 parts by mass of copper phthalocyanine sulfonyl chloride (sulfonation degree=1) was added and reaction was allowed to occur at 5° C. to room temperature for 6 hours. The resultant reaction mixture was heated in a vacuum at 90° C. to remove water to provide a copper phthalocyanine sulfamoyl compound represented by the following (Chem. 21).

[Chem. 21]

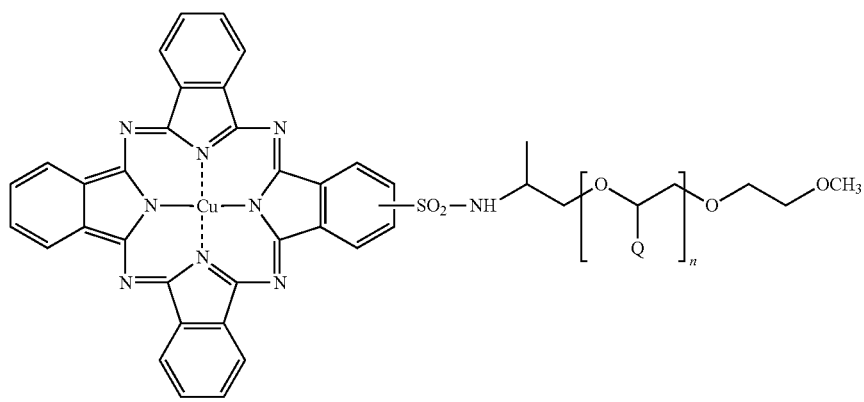

In the compound, Q represents a hydrogen atom or a methyl group; propylene oxide/ethylene oxide=29/6 (molar ratio); average value of n=35.

A phthalocyanine nanorod dispersion liquid (4) was then obtained as in EXAMPLE (1) except that the phthalocyanine derivative represented by (Chem. 21) was used as the substituted phthalocyanine (phthalocyanine derivative) instead of the phthalocyanine derivative represented by (Chem. 10) and that NMP was used as the dispersion medium in the step (b) instead of ortho-dichlorobenzene.

To 180 mg of the phthalocyanine nanorod dispersion liquid (4), 180 mg of NMP was then added to provide an ink composition (4) (photoelectric conversion device material (4)).
<Production of Photoelectric Conversion Device>
A photoelectric conversion device (4) was produced as in EXAMPLE (2) except that the photoelectric conversion device material (4) was used as the photoelectric conversion device material instead of the photoelectric conversion device material (2).
<Evaluation of Photoelectric Conversion Device>
Evaluation of the photoelectric conversion device was performed as in EXAMPLE (1) except that the photoelectric conversion device (4) was used instead of the photoelectric conversion device (1). As a result, $J_{sc}$ was 4.54 mA/cm$^2$; $V_{oc}$ was 0.58 V; FF was 0.44; and PCE calculated from these values was 1.15%.
<Production of Transistor>
A transistor (4) was produced as in EXAMPLE (3) except that the ink composition (4) was used instead of the ink composition (2).
<Evaluation of Transistor>
The transistor (4) was evaluated in terms of transistor characteristics. As a result, the mobility was 10$^{-4}$ and the ON/OFF ratio was 10$^3$.

Example 5

Production of Ink Composition (Photoelectric Conversion Device Material)

A phthalocyanine nanorod dispersion liquid (5) was obtained as in EXAMPLE (1) except that the phthalocyanine derivative represented by (Chem. 6) was used as the substituted phthalocyanine (phthalocyanine derivative) instead of the phthalocyanine derivative represented by (Chem. 10) and that NMP was used as the dispersion medium in the step (b) instead of ortho-dichlorobenzene.

To 180 mg of the phthalocyanine nanorod dispersion liquid (5), 180 mg of NMP was then added to provide an ink composition (5) (photoelectric conversion device material (5)).
<Production of Photoelectric Conversion Device>
A photoelectric conversion device (5) was produced as in EXAMPLE (2) except that the photoelectric conversion device material (5) was used instead of the photoelectric conversion device material (2).
<Evaluation of Photoelectric Conversion Device>
Evaluation of the photoelectric conversion device was performed as in EXAMPLE (1) except that the photoelectric conversion device (5) was used instead of the photoelectric conversion device (1). As a result, $J_{sc}$ was 5.20 mA/cm$^2$; $V_{oc}$ was 0.56 V; FF was 0.39; and PCE calculated from these values was 1.15%.
<Production of Transistor>
A transistor (5) was produced as in EXAMPLE (3) except that the ink composition (5) was used instead of the ink composition (2).
<Evaluation of Transistor>
The transistor characteristics were evaluated as in EXAMPLE (3) except that the transistor (5) was used instead of the transistor (3). As a result, the mobility was 10$^{-4}$ and the ON/OFF ratio was 10$^4$.

Example 6

Production of Ink Composition (Photoelectric Conversion Device Material)

A phthalocyanine nanorod dispersion liquid (6) was obtained as in EXAMPLE (1) except that the phthalocyanine derivative represented by (Chem. 8) was used as the substituted phthalocyanine (phthalocyanine derivative) instead of the phthalocyanine derivative represented by (Chem. 10) and that NMP was used as the dispersion medium in the step (b) instead of ortho-dichlorobenzene.

To 180 mg of the phthalocyanine nanorod dispersion liquid (6), 180 mg of NMP was then added to provide an ink composition (6) (photoelectric conversion device material (6)).
<Production of Photoelectric Conversion Device>
A photoelectric conversion device (6) was produced as in EXAMPLE (2) except that the photoelectric conversion device material (6) was used instead of the photoelectric conversion device material (2).
<Evaluation of Photoelectric Conversion Device>
Evaluation of the photoelectric conversion device was performed as in EXAMPLE (1) except that the photoelectric conversion device (6) was used instead of the photoelectric conversion device (1). As a result, $J_{sc}$ was 4.32 mA/cm$^2$; $V_{oc}$ was 0.54 V; FF was 0.40; and PCE calculated from these values was 0.92%.

<Production of Transistor>
A transistor (6) was produced as in EXAMPLE (3) except that the ink composition (6) was used instead of the ink composition (2).
<Evaluation of Transistor>
The transistor characteristics were evaluated as in EXAMPLE (3) except that the transistor (6) was used instead of the transistor (3). As a result, the mobility was $10^{-4}$ and the ON/OFF ratio was $10^3$.

Example 7 to Example 31

As with the above-described EXAMPLES, EXAMPLES (7) to (31) below were performed so that phthalocyanine nanorods containing various unsubstituted phthalocyanines and substituted phthalocyanines were produced and the characteristics of photoelectric conversion devices containing the phthalocyanine nanorods were evaluated. The results are described in Table 1 (in the table, EXAMPLES that are referred to for the production of phthalocyanine nanorods are described).

Comparative Example 2

Production of Photoelectric Conversion Device

A photoelectric conversion device (2)' was produced as in EXAMPLE (1) except that the phthalocyanine nanowires produced in the step (b) of EXAMPLE (1) were used instead of the phthalocyanine nanorods produced in EXAMPLE (1).
<Evaluation of Photoelectric Conversion Device>
Evaluation of the photoelectric conversion characteristics was performed as in EXAMPLE 1 except that the photoelectric conversion device (2)' was used instead of the photoelectric conversion device (1). As a result, $J_{sc}$ was 4.17 mA/cm$^2$; $V_{oc}$ was 0.56 V; FF was 0.28; and PCE calculated from these values was 0.66%.

Thus, it has been demonstrated that phthalocyanine nanorods according to the present invention have higher solvent dispersibility than phthalocyanine pigment fine particles; accordingly, an ink composition can be easily formed from the phthalocyanine nanorods and hence a photoelectric con-

TABLE 1

| EXAMPLE | Central metal of unsubstituted phthalocyanine | Central metal of substituted phthalocyanine | Substituent of substituted phthalocyanine | Reference EXAMPLES | Fill factor (FF) | Photoelectric conversion efficiency (%) |
|---|---|---|---|---|---|---|
| EXAMPLE 7 | Zinc | Zinc | Sulfonic | EXAMPLE 5 | 0.40 | 0.99 |
| EXAMPLE 8 | Cobalt | Copper | Imide | EXAMPLE 2 | 0.40 | 1.00 |
| EXAMPLE 9 | Nickel | Copper | Sulfamoyl | EXAMPLE 4 | 0.39 | 0.98 |
| EXAMPLE 10 | Tin | Copper | Sulfonic | EXAMPLE 5 | 0.42 | 1.02 |
| EXAMPLE 11 | Lead | Copper | Imide | EXAMPLE 2 | 0.43 | 1.10 |
| EXAMPLE 12 | Magnesium | Copper | Sulfamoyl | EXAMPLE 4 | 0.41 | 1.05 |
| EXAMPLE 13 | Silicon | Copper | Sulfonic | EXAMPLE 5 | 0.40 | 1.09 |
| EXAMPLE 14 | Iron | Copper | Imide | EXAMPLE 2 | 0.40 | 1.05 |
| EXAMPLE 15 | Palladium | Copper | Sulfamoyl | EXAMPLE 4 | 0.40 | 1.04 |
| EXAMPLE 16 | TiO | Copper | Sulfonic | EXAMPLE 5 | 0.41 | 1.08 |
| EXAMPLE 17 | VO | Copper | Imide | EXAMPLE 2 | 0.42 | 1.15 |
| EXAMPLE 18 | AlCl | Copper | Sulfamoyl | EXAMPLE 4 | 0.42 | 1.18 |
| EXAMPLE 19 | Copper | Cobalt | Imide | EXAMPLE 2 | 0.40 | 1.09 |
| EXAMPLE 20 | Copper | Nickel | Sulfamoyl | EXAMPLE 4 | 0.42 | 1.10 |
| EXAMPLE 21 | Copper | Tin | Sulfonic | EXAMPLE 5 | 0.41 | 1.11 |
| EXAMPLE 22 | Copper | Lead | Imide | EXAMPLE 2 | 0.42 | 1.13 |
| EXAMPLE 23 | Copper | Magnesium | Sulfamoyl | EXAMPLE 4 | 0.41 | 1.08 |
| EXAMPLE 24 | Copper | Silicon | Sulfonic | EXAMPLE 5 | 0.41 | 1.07 |
| EXAMPLE 25 | Copper | Iron | Sulfonic | EXAMPLE 5 | 0.40 | 1.09 |
| EXAMPLE 26 | Copper | Palladium | Sulfamoyl | EXAMPLE 4 | 0.42 | 1.13 |
| EXAMPLE 27 | Copper | TiO | Sulfonic | EXAMPLE 5 | 0.40 | 1.10 |
| EXAMPLE 28 | Copper | VO | Imide | EXAMPLE 2 | 0.41 | 1.11 |
| EXAMPLE 29 | Copper | AlCl | Sulfamoyl | EXAMPLE 4 | 0.41 | 1.12 |
| EXAMPLE 30 | None | Copper | Sulfonic | EXAMPLE 5 | 0.42 | 1.21 |
| EXAMPLE 31 | Copper | None | Sulfamoyl | EXAMPLE 4 | 0.40 | 1.06 |

In the substituents of phthalocyanines in the table, Sulfonic denotes a substituent in (Chem. 6), Imide denotes a substituent in (Chem. 10), and Sulfamoyl denotes a substituent in (Chem. 21).

Comparative Example 1

Production of Photoelectric Conversion Device

A photoelectric conversion device was produced as in EXAMPLE (1) except that copper phthalocyanine pigment fine particles were used instead of phthalocyanine nanorods of the photoelectric conversion device material (1). Since the copper phthalocyanine pigment fine particles had a low dispersibility in a solvent, the dispersion liquid had poor film-formation capability and a photoelectric conversion device was not produced from the dispersion liquid.

version device can be produced by a wet process. In addition, it has been demonstrated that, compared with photoelectric conversion devices formed from phthalocyanine nanowires, photoelectric conversion devices formed from phthalocyanine nanorods according to the present invention have a high fill factor (FF) and, as a result, have a high photoelectric conversion efficiency.

INDUSTRIAL APPLICABILITY

Use of phthalocyanine nanorods according to the present invention can provide photoelectric conversion devices having a long life derived from high durability of phthalocyanine and being produced at a low cost by a wet process. In addition, use of such photoelectric conversion devices can constitute a solar-cell module having a long life and being produced at a low cost, due to the feature of the photoelectric conversion devices.

REFERENCE SIGNS LIST 1 substrate
2 electrode a
3 photoelectric conversion layer
4 electrode b
5 layer containing phthalocyanine nanorods according to the present invention (in the case of electrode a being positive electrode) or electron-accepting-material-containing layer (in the case of electrode a being negative electrode)
6 electron-accepting-material-containing layer (in the case of electrode b being negative electrode) or layer containing phthalocyanine nanorods according to the present invention (in the case of electrode b being positive electrode)

The invention claimed is:

1. A phthalocyanine nanorod comprising an unsubstituted phthalocyanine and a substituted phthalocyanine, the phthalocyanine nanorod having a breadth of 100 nm or less and a ratio (length/breadth) of a length to the breadth, the ratio being less than 10, the unsubstituted phthalocyanine being represented by a general formula (1) or (2)

[Chem. 1]

(1)

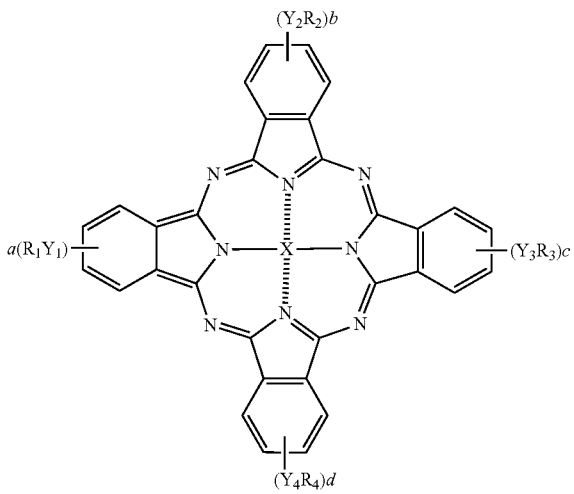

(2)

(where X represents any one selected from the group consisting of a copper atom, a zinc atom, a cobalt atom, a nickel atom, a tin atom, a lead atom, a magnesium atom, a silicon atom, an iron atom, a palladium atom, TiO, VO, and AlCl), and the substituted phthalocyanine being represented by a general formula (3) or (4)

[Chem. 2]

(3)

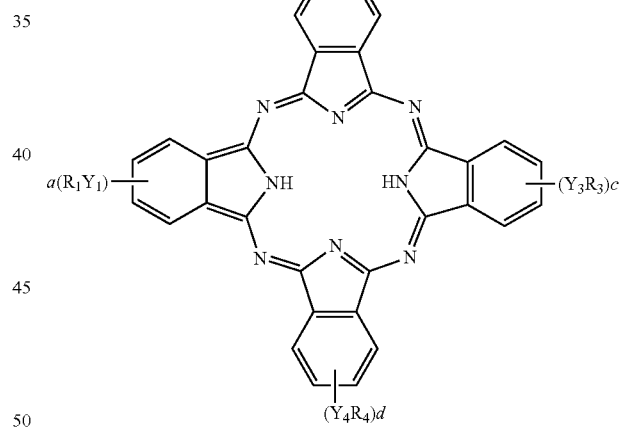

(4)

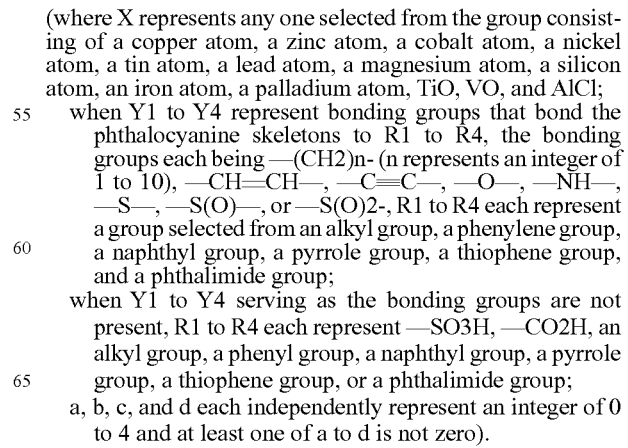

(where X represents any one selected from the group consisting of a copper atom, a zinc atom, a cobalt atom, a nickel atom, a tin atom, a lead atom, a magnesium atom, a silicon atom, an iron atom, a palladium atom, TiO, VO, and AlCl;

when Y1 to Y4 represent bonding groups that bond the phthalocyanine skeletons to R1 to R4, the bonding groups each being —$(CH2)n$- (n represents an integer of 1 to 10), —CH=CH—, —C≡C—, —O—, —NH—, —S—, —S(O)—, or —$S(O)2$-, R1 to R4 each represent a group selected from an alkyl group, a phenylene group, a naphthyl group, a pyrrole group, a thiophene group, and a phthalimide group;

when Y1 to Y4 serving as the bonding groups are not present, R1 to R4 each represent —SO3H, —CO2H, an alkyl group, a phenyl group, a naphthyl group, a pyrrole group, a thiophene group, or a phthalimide group;

a, b, c, and d each independently represent an integer of 0 to 4 and at least one of a to d is not zero).

2. The phthalocyanine nanorod according to claim 1, wherein the substituted phthalocyanine is represented by a general formula (5) or (6)

[Chem. 3]

(5)

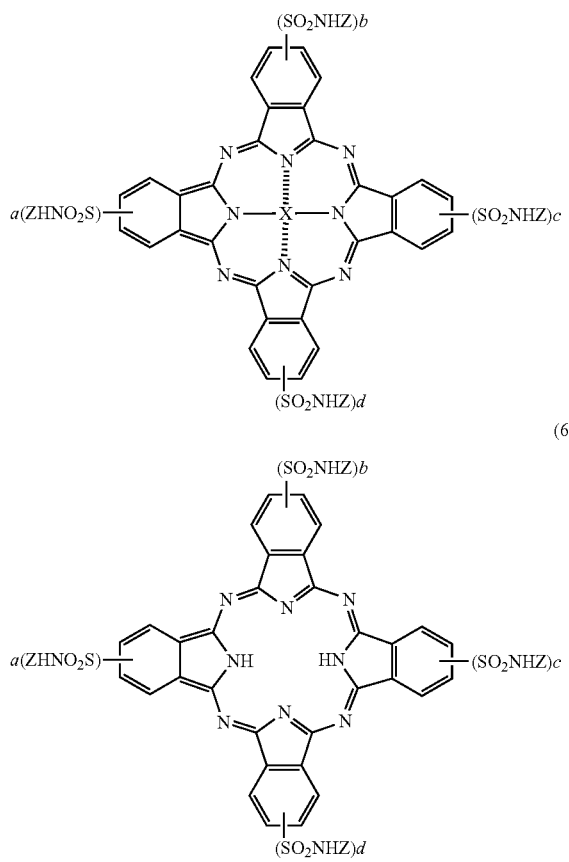

(6)

(where X represents any one selected from the group consisting of a copper atom, a zinc atom, a cobalt atom, a nickel atom, a tin atom, a lead atom, a magnesium atom, a silicon atom, an iron atom, a palladium atom, TiO, VO, and AlCl; Z represents a group represented by a formula (a) or (b) below; and a, b, c, and d each independently represent an integer of 0 to 4 and at least one of a to d is not zero),

[Chem. 4]

(a)

$$Q'\!-\!O\!-\!(CH_2CHO)_n\!-\!CH_2\!-\!CH\!- $$
$$\qquad\qquad\ \ \ |\qquad\qquad\ \ |$$
$$\qquad\qquad\ \ Q\qquad\qquad\ \ Q$$

(where n represents an integer of 4 to 100; Q each independently represents a hydrogen atom or a methyl group; and Q' represents a methyl group, an ethyl group, a n-propyl group, an isopropyl group, an n-butyl group, an isobutyl group, a n-pentyl group, a n-hexyl group, a n-octyl group, a 2-ethyl-hexyl group, a n-dodecyl group, a stearyl group, a n-tetracosyl group, a n-triacontyl group, a vinyl group, a propenyl group, an isopropenyl group, a butenyl group, a pentenyl group, an isoprene group, a hexenyl group, a heptenyl group, an octenyl group, a decenyl group, a geranyl group, an ethynyl group, a 2-propynyl group, or a 2-pentene-4-ynyl group), and

[Chem. 5]

(b)

(where m represents an integer of 1 to 20; and R and R' each independently represent an alkyl group having 1 to 20 carbon atoms).

3. The phthalocyanine nanorod according to claim 1, wherein the substituted phthalocyanine is represented by a general formula (7) or (8)

[Chem. 16]

(7)

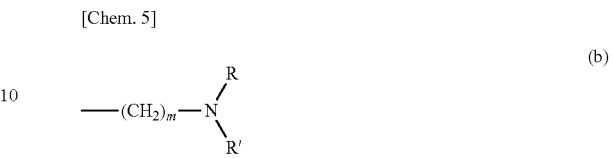

(where X represents a copper atom or a zinc atom; n represents an integer of 1 to 20; m represents an average number of the substituent introduced, the average number being 0 to 4; and R1 to R4 each independently represent a halogen, an alkyl group having 1 to 20 carbon atoms, an alkyloxy group having 1 to 20 carbon atoms, or an alkylthio group having 1 to 20 carbon atoms) and

[Chem. 7]

(8)

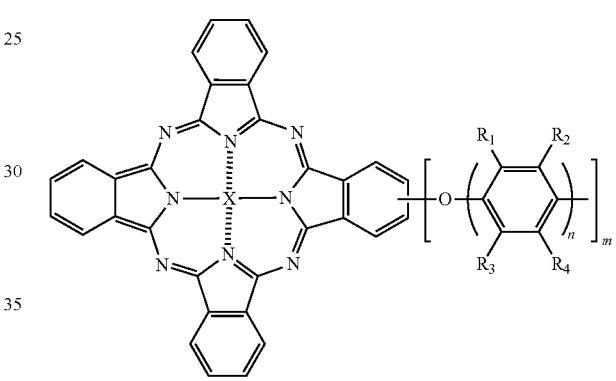

(where X represents a copper atom or a zinc atom; n represents an integer of 1 to 20; m represents an average number of the substituent introduced, the average number being 0 to 4; and R1 and R2 each independently represent a halogen, an alkyl group having 1 to 20 carbon atoms, an alkyloxy group having 1 to 20 carbon atoms, or an alkylthio group having 1 to 20 carbon atoms).

4. An ink composition comprising, as essential components, the phthalocyanine nanorod according to claim 1 and N-methylpyrrolidone, N,N-dimethylformamide, N,N-diethylformamide, N,N-dimethylacetamide, toluene, xylene, ethylbenzene, chlorobenzene, dichlorobenzene, chloroform, methylene chloride, or dichloroethane.

5. The ink composition according to claim 4, wherein a content of the phthalocyanine nanorod is 0.05 to 20 mass %.

6. The ink composition according to claim 4, further comprising polythiophene, poly-p-phenylenevinylene, poly-p-phenylene, polyfluorene, polypyrrole, polyaniline, polyacetylene, polythienylenevinylene, polyvinylcarbazole, polymethyl methacrylate, polystyrene, or polycarbonate.

7. A transistor comprising a channel region containing the phthalocyanine nanorod according to claim 1.

8. A method for producing a transistor that is the transistor comprising a channel region containing the phthalocyanine nanorod, the method comprising
forming a film from the ink composition according to claim 4 to form a channel region.

9. A material for a photoelectric conversion device, the material comprising the phthalocyanine nanorod according to claim 1.

10. The material for a photoelectric conversion device according to claim 9, further comprising 1,4,5,8-naphthalenetetracarboxylic diimide (NTCDI), 1,4,5,8-naphthalenetetracarboxylic dianhydride (NTCDA), 3,4,9,10-perylenetetracarboxylic dianhydride (PTCDA), 3,4,9,10-perylenetetracarboxylic bisbenzimidazole (PTCBI), 2-(4-biphenylyl)-5-(4-t-butylphenyl)-1,3,4-oxadiazole (PBD), 2,5-di(1-naphthyl)-1,3,4-oxadiazole (BND), 3-(4-biphenylyl)-4-phenyl-5-(4-t-butylphenyl)-1,2,4-triazole (TAZ), phenanthroline, phosphine oxide, C60 fullerene, C70 fullerene, C76 fullerene, C78 fullerene, C82 fullerene, C84 fullerene, C90 fullerene, C94 fullerene, [6,6]-phenyl-C61-butyric acid methyl ester, [6,6]-phenyl-C61-butyric acid hexyl ester, [6,6]-phenyl-C61-butyric acid dodecyl ester, phenyl-C71-butyric acid methyl ester, phenyl-C85-butyric acid methyl ester, carbon nanotube (CNT), poly-p-phenylenevinylene having a cyano group, poly[(1,4-divinylenephenylene)(2,4,6-triisopropylphenylborane)], or poly[(2,5-didecyloxy-1,4-phenylene)(2,4,6-triisopropylphenylborane)], diphenyl terminated.

11. A photoelectric conversion device comprising a positive electrode, a negative electrode, and a film containing the phthalocyanine nanorod according to claim 1, the film being disposed between the positive electrode and the negative electrode.

12. A method for producing a photoelectric conversion device comprising a positive electrode, a negative electrode, and a film containing the phthalocyanine nanorod, the method comprising
a step of forming a film from the material for a photoelectric conversion device according to claim 9 such that the film is disposed between a positive electrode and a negative electrode.

13. A method for producing a phthalocyanine nanorod that is the phthalocyanine nanorod according to claim 1, the method comprising:

(1) a step of dissolving an unsubstituted phthalocyanine and a substituted phthalocyanine in sulfuric acid, chlorosulfuric acid, methanesulfonic acid, or trifluoroacetic acid and subsequently precipitating the phthalocyanines in water or an aqueous solution mainly containing water, to provide a composite;

(2) a step of forming the composite provided in the step (1), into a nanowire by subjecting the composite to stirring or standing still in a temperature range of 5° C. to 250° C. in N,N-dimethylacetamide, N,N-dimethylformamide, N-methylpyrrolidone, toluene, xylene, ethylbenzene, chlorobenzene, or dichlorobenzene; and (3) a step of forming the nanowire provided in the step (2), into a nanorod in the organic solvent described in (2) above by a stirring process, a dispersion-stirring process, a dispersion-homogenization process, an ultrasonic radiation process, an ultrasonic stirring process, an ultrasonic homogenization process, an ultrasonic dispersion process, or a laser radiation process, the unsubstituted phthalocyanine being represented by a general formula (1) or (2)

[Chem. 8]

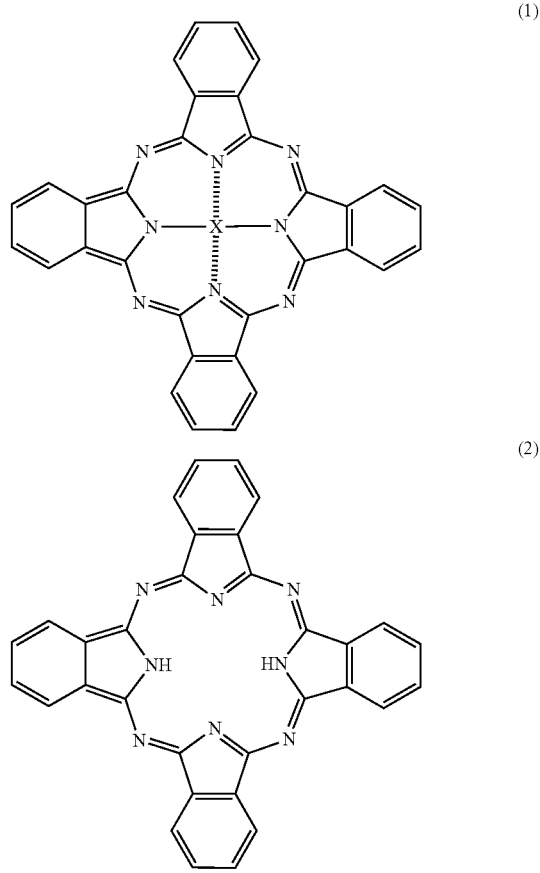

(where X represents any one selected from the group consisting of a copper atom, a zinc atom, a cobalt atom, a nickel atom, a tin atom, a lead atom, a magnesium atom, a silicon atom, an iron atom, a palladium atom, TiO, VO, and AlCl), and the substituted phthalocyanine being represented by a general formula (3), (4), (5), (6), (7), or (8)

[Chem. 9]

(3)

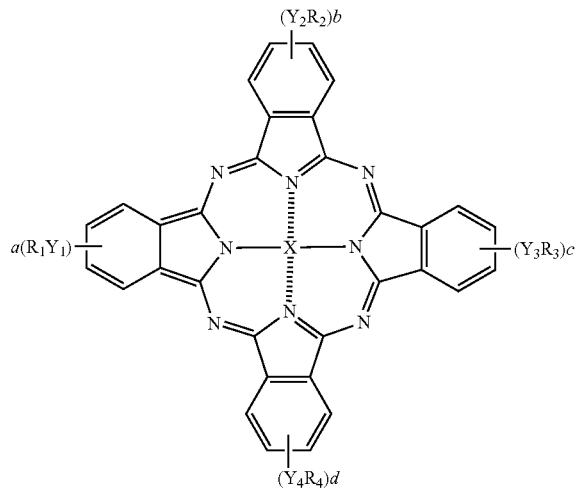

(4)

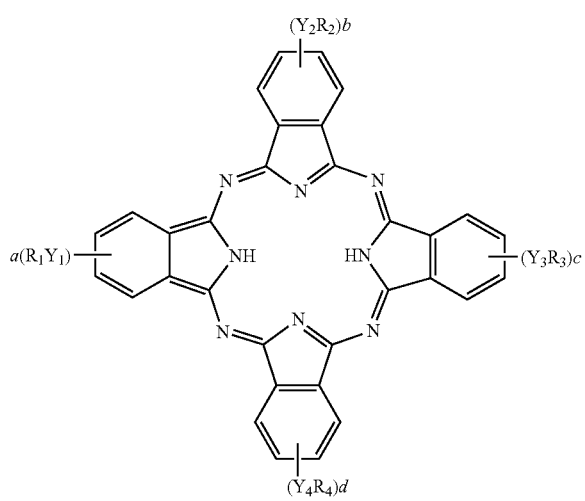

(where X represents any one selected from the group consisting of a copper atom, a zinc atom, a cobalt atom, a nickel atom, a tin atom, a lead atom, a magnesium atom, a silicon atom, an iron atom, a palladium atom, TiO, VO, and AlCl;

when Y1 to Y4 represent bonding groups that bond the phthalocyanine skeletons to R1 to R4, the bonding groups each being —(CH2)n- (n represents an integer of 1 to 10), —CH=CH—, —C≡C—, —O—, —NH—, —S—, —S(O)—, or —S(O)2-, R1 to R4 each represent a group selected from an alkyl group, a phenylene group, a naphthyl group, a pyrrole group, a thiophene group, and a phthalimide group;

when Y1 to Y4 serving as the bonding groups are not present, R1 to R4 each represent —SO3H, —CO2H, an alkyl group, a phenyl group, a naphthyl group, a pyrrole group, a thiophene group, or a phthalimide group;

a, b, c, and d each independently represent an integer of 0 to 4 and at least one of a to d is not zero),

[Chem. 10]

(5)

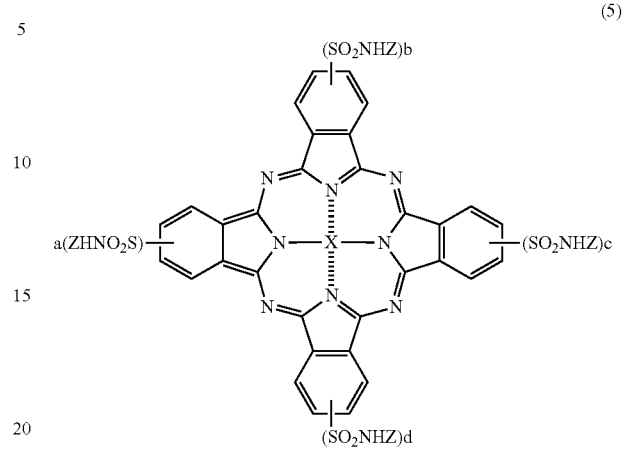

(6)

(where X represents any one selected from the group consisting of a copper atom, a zinc atom, a cobalt atom, a nickel atom, a tin atom, a lead atom, a magnesium atom, a silicon atom, an iron atom, a palladium atom, TiO, VO, and AlCl; Z represents a group represented by a formula (a) or (b) below; and a, b, c, and d each independently represent an integer of 0 to 4 and at least one of a to d is not zero),

[Chem. 11]

(a)

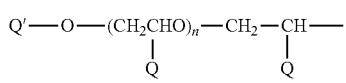

(where n represents an integer of 4 to 100; Q each independently represents a hydrogen atom or a methyl group; and Q' represents a methyl group, an ethyl group, a n-propyl group, an isopropyl group, a n-butyl group, an isobutyl group, a n-pentyl group, a n-hexyl group, a n-octyl group, a 2-ethylhexyl group, a n-dodecyl group, a stearyl group, a n-tetracosyl group, a n-triacontyl group, a vinyl group, a propenyl group, an isopropenyl group, a butenyl group, a pentenyl group, an isoprene group, a hexenyl group, a heptenyl group, an octenyl group, a decenyl group, a geranyl group, an ethynyl group, a 2-propynyl group, or a 2-pentene-4-ynyl group),

[Chem. 12]

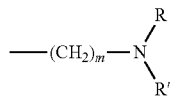

(b)

(where m represents an integer of 1 to 20; and R and R' each independently represent an alkyl group having 1 to 20 carbon atoms),

[Chem. 13]

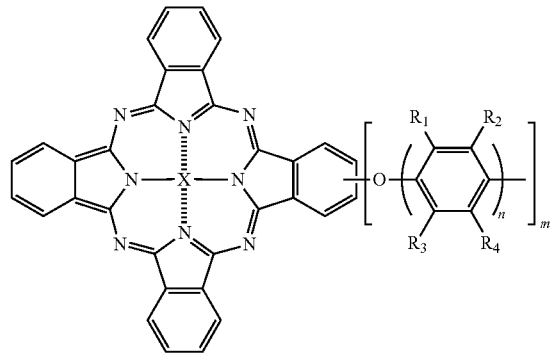

(7)

(where X represents a copper atom or a zinc atom; n represents an integer of 1 to 20; m represents an average number of the substituent introduced, the average number being 0 to 4; and R1 to R4 each independently represent a halogen, an alkyl group having 1 to 20 carbon atoms, an alkyloxy group having 1 to 20 carbon atoms, or an alkylthio group having 1 to 20 carbon atoms), and

[Chem. 14]

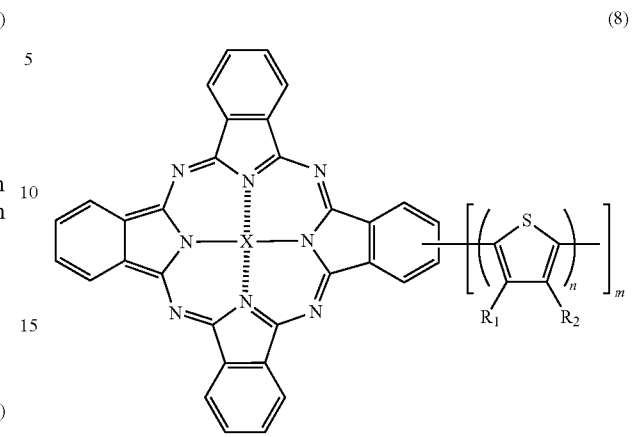

(8)

(where X represents a copper atom or a zinc atom; n represents an integer of 1 to 20; m represents an average number of the substituent introduced, the average number being 0 to 4; and R1 and R2 each independently represent a halogen, an alkyl group having 1 to 20 carbon atoms, an alkyloxy group having 1 to 20 carbon atoms, or an alkylthio group having 1 to 20 carbon atoms).

14. The method for producing a phthalocyanine nanorod according to claim 13, wherein the nanowire provided in the step (2) has a breadth of 100 nm or less and a ratio (length/breadth) of a length to the breadth, the ratio being 10 or more.

15. The method for producing a phthalocyanine nanorod according to claim 13, wherein the step of forming the composite into the nanowire by subjecting the composite to stirring or standing still in a temperature range of 5° C. to 250° C. in N,N-dimethylacetamide, N,N-dimethylformamide, N-methylpyrrolidone, toluene, xylene, ethylbenzene, chlorobenzene, or dichlorobenzene, is a step of dispersing the composite in N,N-dimethylacetamide, N,N-dimethylformamide, N-methylpyrrolidone, toluene, xylene, ethylbenzene, chlorobenzene, or dichlorobenzene and subsequently forming the composite into the nanowire by stirring or standing still in a temperature range of 5° C. to 250° C.

* * * * *